United States Patent
Utsunomiya et al.

(10) Patent No.: US 10,026,491 B2
(45) Date of Patent: Jul. 17, 2018

(54) SEMICONDUCTOR MEMORY DEVICE AND MEMORY SYSTEM

(71) Applicant: Toshiba Memory Corporation, Tokyo (JP)

(72) Inventors: Yuko Utsunomiya, Yokohama Kanagawa (JP); Takahiro Shimizu, Yokohama Kanagawa (JP); Yoshihiko Shindo, Fujisawa Kanagawa (JP); Akio Sugahara, Yokohama Kanagawa (JP); Toshio Yamamura, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/445,987

(22) Filed: Mar. 1, 2017

(65) Prior Publication Data

US 2018/0075917 A1 Mar. 15, 2018

(30) Foreign Application Priority Data

Sep. 12, 2016 (JP) .................. 2016-177985

(51) Int. Cl.
*G11C 7/10* (2006.01)
*G11C 16/34* (2006.01)
*G11C 16/04* (2006.01)
*G11C 16/26* (2006.01)
*G11C 16/10* (2006.01)
(Continued)

(52) U.S. Cl.
CPC .......... *G11C 16/3459* (2013.01); *G06F 3/065* (2013.01); *G06F 3/067* (2013.01); *G06F 3/0619* (2013.01); *G06F 11/1451* (2013.01); *G06F 11/1469* (2013.01); *G11C 16/0483* (2013.01); *G11C 16/10* (2013.01); *G11C 16/26* (2013.01); *G06F 2201/84* (2013.01)

(58) Field of Classification Search
CPC ..... G11C 16/3459; G11C 16/10; G11C 16/26; G11C 16/0483; G06F 11/1451; G06F 11/1469; G06F 3/067; G06F 3/065; G06F 3/0619; G06F 2201/84
See application file for complete search history.

(56) References Cited

U.S. PATENT DOCUMENTS 6,236,619 B1 * 5/2001 Cho .................... G11C 7/1072
365/195
7,120,051 B2 10/2006 Gorobets et al.
(Continued)

*Primary Examiner* — Mohammed A Bashar
(74) *Attorney, Agent, or Firm* — Patterson & Sheridan, LLP

(57) ABSTRACT

A semiconductor memory device includes memory cells, a sense amplifier unit including a first latch circuit, and a control unit configured to execute read and write operations on the memory cells. The control unit, while executing the write operation on the memory cells, responsive to a write suspend command followed by a read command, performs a data saving operation, the read operation, and a data restoring operation prior to resuming the write operation. The data saving operation includes transferring first data stored in the first latch circuit to an external device, the first data including at least a result of verify operation performed on the memory cells. The data restoring operation includes transferring the first data to the first latch circuit.

17 Claims, 30 Drawing Sheets

(51) Int. Cl.
*G06F 3/06* (2006.01)
*G06F 11/14* (2006.01)

(56) References Cited

U.S. PATENT DOCUMENTS

| | | |
|---|---|---|
| 7,636,261 B2 | 12/2009 | Shibata |
| 9,558,837 B2 | 1/2017 | Harada et al. |
| 2016/0012902 A1* | 1/2016 | Harada ................. G11C 16/10 365/185.22 |

* cited by examiner

FIG. 12

| TRANSMISSION SOURCE LATCH CIRCUIT IDENTIFICATION INFORMATION | TRANSMISSION DESTINATION LATCH CIRCUIT IDENTIFICATION INFORMATION |
|---|---|
| ADL : 000<br>BDL : 001<br>CDL : 010<br>DDL : 011<br>SDL : 100<br>XDL : 101 | ADL : 000<br>BDL : 001<br>CDL : 010<br>DDL : 011<br>SDL : 100<br>XDL : 101 |

FIG. 13

| | DATA IN LATCH CIRCUIT | | | | | |
|---|---|---|---|---|---|---|
| | XDL | ADL | BDL | CDL | DDL | SDL |
| BEFORE DATA SAVING | C | L | M | U | Q | W(WE) |
| DURING DATA SAVING | (WE) | L | M | U | Q | W(WE) |
| | L | (WE) | M | U | Q | W(WE) |
| | (WE) | (WE) | M | U | Q | W(WE) |
| AFTER DATA READING | ROP | ROP | M | U | Q | R |

FIG. 15

|  | DATA IN LATCH CIRCUIT ||||||
| --- | --- | --- | --- | --- | --- | --- |
|  | XDL | ADL | BDL | CDL | DDL | SDL |
| BEFORE DATA RESTORING | ROP (WE) | ROP (WE) | M | U | Q | R(WE) |
| DURING DATA RESTORING | L | ROP (WE) | M | U | Q | R(WE) |
| | (WE) | L | M | U | Q | R(WE) |
| | C | L | M | U | Q | R(WE) |
| AFTER DATA RESTORING | C | L | M | U | Q | W |

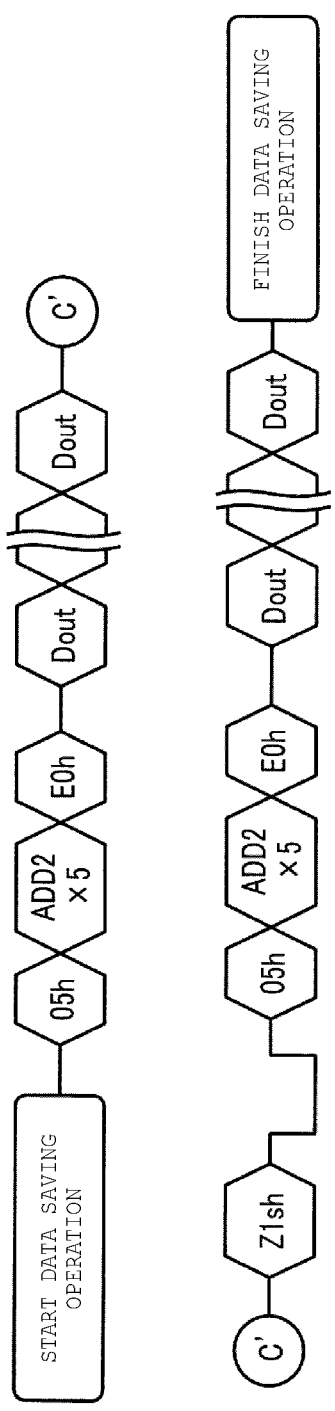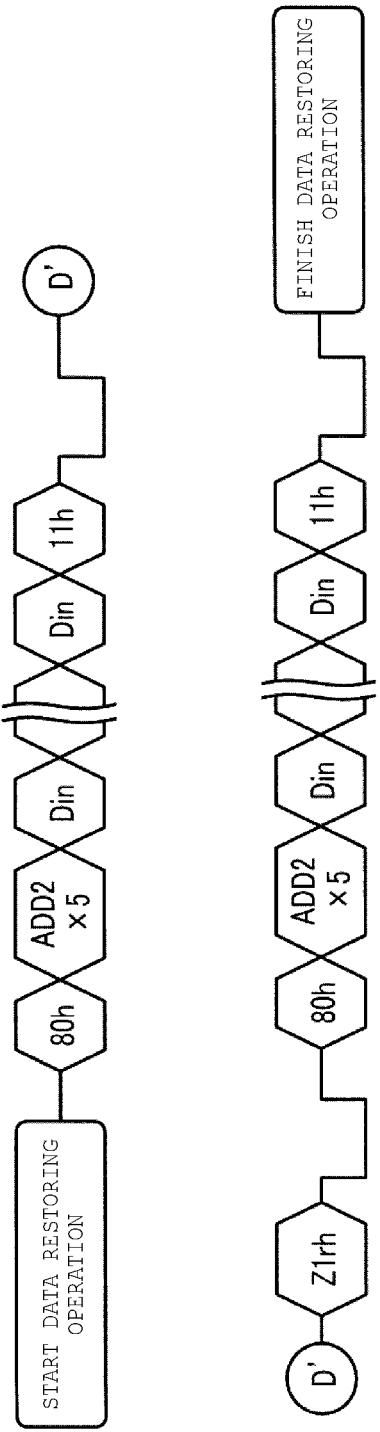

FIG. 19

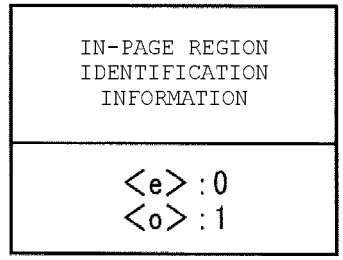

| IN-PAGE REGION IDENTIFICATION INFORMATION |
|---|
| ⟨e⟩ : 0 <br> ⟨o⟩ : 1 |

FIG. 20

START DATA SAVING OR RESTORING OPERATION — ZZh — ADD3 ×k — FINISH DATA SAVING OR RESTORING OPERATION

FIG. 21

| TRANSMISSION SOURCE | | TRANSMISSION DESTINATION | |
|---|---|---|---|
| IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| ⟨e⟩ : 0 <br> ⟨o⟩ : 1 | ADL : 000 <br> BDL : 001 <br> CDL : 010 <br> DDL : 011 <br> SDL : 100 <br> XDL : 101 | ⟨e⟩ : 0 <br> ⟨o⟩ : 1 | ADL : 000 <br> BDL : 001 <br> CDL : 010 <br> DDL : 011 <br> SDL : 100 <br> XDL : 101 |

FIG. 22
|  | DATA IN LATCH CIRCUIT ||||||||
|---|---|---|---|---|---|---|---|---|
|  | XDL | ADL || BDL | CDL | DDL | SDL ||
|  |  | ⟨e⟩ | ⟨o⟩ |  |  |  | ⟨e⟩ | ⟨o⟩ |
| BEFORE DATA SAVING | C | L || M | U | Q | W(WE) ||
| DURING DATA SAVING | C | (WE) | L | M | U | Q | W(WE) | L |
| AFTER DATA READING | C | ROP | L | M | U | Q | R | L |
| DURING DATA RESTORING | C | L || M | U | Q | R(WE) | ROP(WE) |
| AFTER DATA RESTORING | C | L || M | U | Q | W ||
FIG. 23
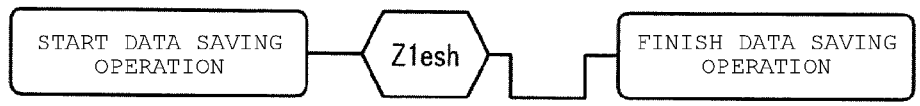
FIG. 24
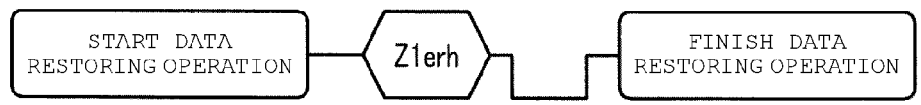
FIG. 25
| IN-PAGE REGION IDENTIFICATION INFORMATION |
|---|
| ⟨e1⟩ : 00<br>⟨e2⟩ : 01<br>⟨o1⟩ : 10<br>⟨o2⟩ : 11 |

*FIG. 27*

| TRANSMISSION SOURCE | | TRANSMISSION DESTINATION | |
|---|---|---|---|
| IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| <e1> : 00<br><e2> : 01<br><o1> : 10<br><o2> : 11 | ADL : 000<br>BDL : 001<br>CDL : 010<br>DDL : 011<br>SDL : 100<br>XDL : 101 | <e1> : 00<br><e2> : 01<br><o1> : 10<br><o2> : 11 | ADL : 000<br>BDL : 001<br>CDL : 010<br>DDL : 011<br>SDL : 100<br>XDL : 101 |

FIG. 28

DATA IN LATCH CIRCUIT

| | XDL ⟨e1⟩ | XDL ⟨e2⟩ | XDL ⟨o1⟩ | XDL ⟨o2⟩ | ADL ⟨e1⟩ | ADL ⟨e2⟩ | ADL ⟨o1⟩ | ADL ⟨o2⟩ | BDL ⟨e1⟩ | BDL ⟨e2⟩ | BDL ⟨o1⟩ | BDL ⟨o2⟩ | CDL | DDL | SDL ⟨e1⟩ | SDL ⟨e2⟩ | SDL ⟨o1⟩ | SDL ⟨o2⟩ |
|---|---|---|---|---|---|---|---|---|---|---|---|---|---|---|---|---|---|---|
| BEFORE DATA SAVING | | C | | | | L | | | | M | | | U | Q | | W(WE) | | |
| DURING DATA SAVING | (WE) | C | | | | L | | | | M | | | U | Q | | W(WE) | | C |
| | (WE) | C | | | (WE) | L | | | | M | | | U | Q | | W(WE) | | C |
| | (WE) | C | | | (WE) | L | | | | M | | | U | Q | W(WE) | | | C |
| AFTER DATA READIN | ROP | C | | | ROP | L | | | (WE) | M | | | U | Q | R(WE) | M | L | C |
| | ROP(WE) | C | | | ROP(WE) | L | | | ROP | M | | | U | Q | R(WE) | M | L | C |
| DURING DATA RESTORING | ROP(WE) | C | | | | L | | | | M | | | U | Q | R(WE) | ROP(WE) | L | C |
| | | | | | | L | | | | M | | | U | Q | R(WE) | ROP(WE) | L | C |
| AFTER DATA RESTORING | | C | | | | L | | | | M | | | U | Q | | W | | |

FIG. 34

|  | DATA IN LATCH CIRCUIT ||||||
|---|---|---|---|---|---|---|
|  | XDL | ADL | BDL | CDL | DDL | SDL |
| BEFORE DATA READING | C | L | M | U | Q | W (WE) |
| AFTER DATA READING | ROP | ROP | M | U | Q | R |
| DURING DATA RESTORING — DATA IN | C | L (NUP) | M | U | Q | R (WE) |
| DURING DATA RESTORING — PRE-VERIFICATION | C | L | M | U | Q | R (WE) |
| AFTER DATA RESTORING (RESUME LOOP) | C | L | M | U | Q | W |

| | DATA IN LATCH CIRCUIT | | | | | |
|---|---|---|---|---|---|---|
| | XDL | ADL | BDL | CDL | DDL | SDL |
| START OF WRITING SUSPENSION PERIOD | C | L | M | U | Q | W (WE) |
| AFTER DATA READING | C | L | M | U | ROP | R |
| AFTER ONE LOOP OF RESUMED DATA WRITING | C | L | M | U | Q | W |

| DATA SAVING LOCATION SETTING INFORMATION |
|---|
| SAVING TO CONTROLLER: 0<br>SAVING TO SENSE AMPLIFIER UNIT: 1 |

FIG. 39

| DATA SAVING LOCATION SETTING INFORMATION | TRANSMISSION SOURCE | | TRANSMISSION DESTINATION | |
|---|---|---|---|---|
| | IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| SAVING TO CONTROLLER: 0<br>SAVING TO SENSE AMPLIFIER UNIT: 1 | [DATA SAVING LOCATION SETTING INFORMATION:<br>IN CASE OF 0]<br>UNUSED<br>[DATA SAVING LOCATION SETTING INFORMATION:<br>IN CASE OF 1]<br><e>: 0<br><o>: 1 | ADL: 000<br>BDL: 001<br>CDL: 010<br>DDL: 011<br>SDL: 100<br>XDL: 101 | [DATA SAVING LOCATION SETTING INFORMATION:<br>IN CASE OF 0]<br>UNUSED<br>[DATA SAVING LOCATION SETTING INFORMATION:<br>IN CASE OF 1]<br><e>: 0<br><o>: 1 | ADL: 000<br>BDL: 001<br>CDL: 010<br>DDL: 011<br>SDL: 100<br>XDL: 101 |

FIG. 40

| DATA SAVING LOCATION SETTING INFORMATION | TRANSMISSION SOURCE | | TRANSMISSION DESTINATION | |
|---|---|---|---|---|
| | IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| SAVING TO CONTROLLER: 0<br>SAVING TO SENSE AMPLIFIER UNIT: 1 | [DATA SAVING LOCATION SETTING INFORMATION:<br>IN CASE OF 0]<br>UNUSED<br>[DATA SAVING LOCATION SETTING INFORMATION:<br>IN CASE OF 1]<br><e1>: 00<br><e2>: 01<br><o1>: 10<br><o2>: 11 | ADL: 000<br>BDL: 001<br>CDL: 010<br>DDL: 011<br>SDL: 100<br>XDL: 101 | [DATA SAVING LOCATION SETTING INFORMATION:<br>IN CASE OF 0]<br>UNUSED<br>[DATA SAVING LOCATION SETTING INFORMATION:<br>IN CASE OF 1]<br><e1>: 00<br><e2>: 01<br><o1>: 10<br><o2>: 11 | ADL: 000<br>BDL: 001<br>CDL: 010<br>DDL: 011<br>SDL: 100<br>XDL: 101 |

FIG. 41

| PLANE SELECTION INFORMATION | TRANSMISSION SOURCE | | TRANSMISSION DESTINATION | |
|---|---|---|---|---|
| | IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| PLANE 0: 00<br>PLANE 1: 01<br>MULTI-PLANE: 10 | \<e\>: 0<br>\<o\>: 1 | ADL: 000<br>BDL: 001<br>CDL: 010<br>DDL: 011<br>SDL: 100<br>XDL: 101 | \<e\>: 0<br>\<o\>: 1 | ADL: 000<br>BDL: 001<br>CDL: 010<br>DDL: 011<br>SDL: 100<br>XDL: 101 |

FIG. 42

| PLANE SELECTION INFORMATION | TRANSMISSION SOURCE | | TRANSMISSION DESTINATION | |
|---|---|---|---|---|
| | IN-PAGE REGION IDENTIFICATION INFORMATION | LATCH CIRCUIT IDENTIFICATION INFORMATION | IN-PAGE REGION IDENTIFICATION INFORMATION | LATCH CIRCUIT IDENTIFICATION INFORMATION |
| PLANE 0: 00<br>PLANE 1: 01<br>MULTI-PLANE: 10 | \<e1\>: 00<br>\<e2\>: 01<br>\<o1\>: 10<br>\<o2\>: 11 | ADL: 000<br>BDL: 001<br>CDL: 010<br>DDL: 011<br>SDL: 100<br>XDL: 101 | \<e1\>: 00<br>\<e2\>: 01<br>\<o1\>: 10<br>\<o2\>: 11 | ADL: 000<br>BDL: 001<br>CDL: 010<br>DDL: 011<br>SDL: 100<br>XDL: 101 |

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2016-177985, filed Sep. 12, 2016, the entire contents of which are incorporated herein by reference.

FIELD

Embodiments described herein relate generally to a semiconductor memory device and a memory system.

BACKGROUND

A memory system including a NAND flash memory as a semiconductor memory device, and a controller controlling the NAND flash memory, is known.

DESCRIPTION OF THE DRAWINGS

FIG. 12 is a table showing identification information used in transmitting data between latch circuits of the semiconductor memory device according to the first embodiment.

FIG. 13 is a table showing changes in data in the latch circuits during a write operation suspension period in the semiconductor memory device according to the first embodiment.

FIG. 15 is a table for showing changes in data in the latch circuits during a write operation suspension period in the semiconductor memory device according to the first embodiment.

FIG. 16 is a command sequence for a data saving operation for the semiconductor memory device according to a modification example of the first embodiment.

FIG. 17 is a command sequence for a data restoring operation for the semiconductor memory device according to a modification example of the first embodiment.

FIG. 19 is a table showing reading range setting information in the semiconductor memory device according to the second embodiment.

FIG. 20 is a command sequence for a data saving operation or a data restoring operation for the semiconductor memory device of the second embodiment.

FIG. 21 is a table showing identification information used in transmitting data between latch circuits of the semiconductor memory device according to the second embodiment.

FIG. 22 is a table showing changes in data in the latch circuits during a write operation suspension period in the semiconductor memory device according to the second embodiment.

FIG. 23 is a command sequence for a data saving operation for the semiconductor memory device according to a modification example of the second embodiment.

FIG. 24 is a command sequence for a data restoring operation for the semiconductor memory device according to a modification example of the second embodiment.

FIG. 25 is a table showing reading range setting information in a semiconductor memory device according to a third embodiment.

FIG. 27 is a table showing identification information used in transmitting data between latch circuits of the semiconductor memory device according to the third embodiment.

FIG. 28 is a table showing changes in data in the latch circuits during a write operation suspension period in the semiconductor memory device according to the third embodiment.

FIG. 34 is a table showing changes in data in the latch circuits during a write operation suspension period in the semiconductor memory device according to the fourth embodiment.

FIGS. 39-42 are tables showing identification information used in transmitting data between latch circuits of the semiconductor memory device according to various modification examples.

DETAILED DESCRIPTION

Figure 1:
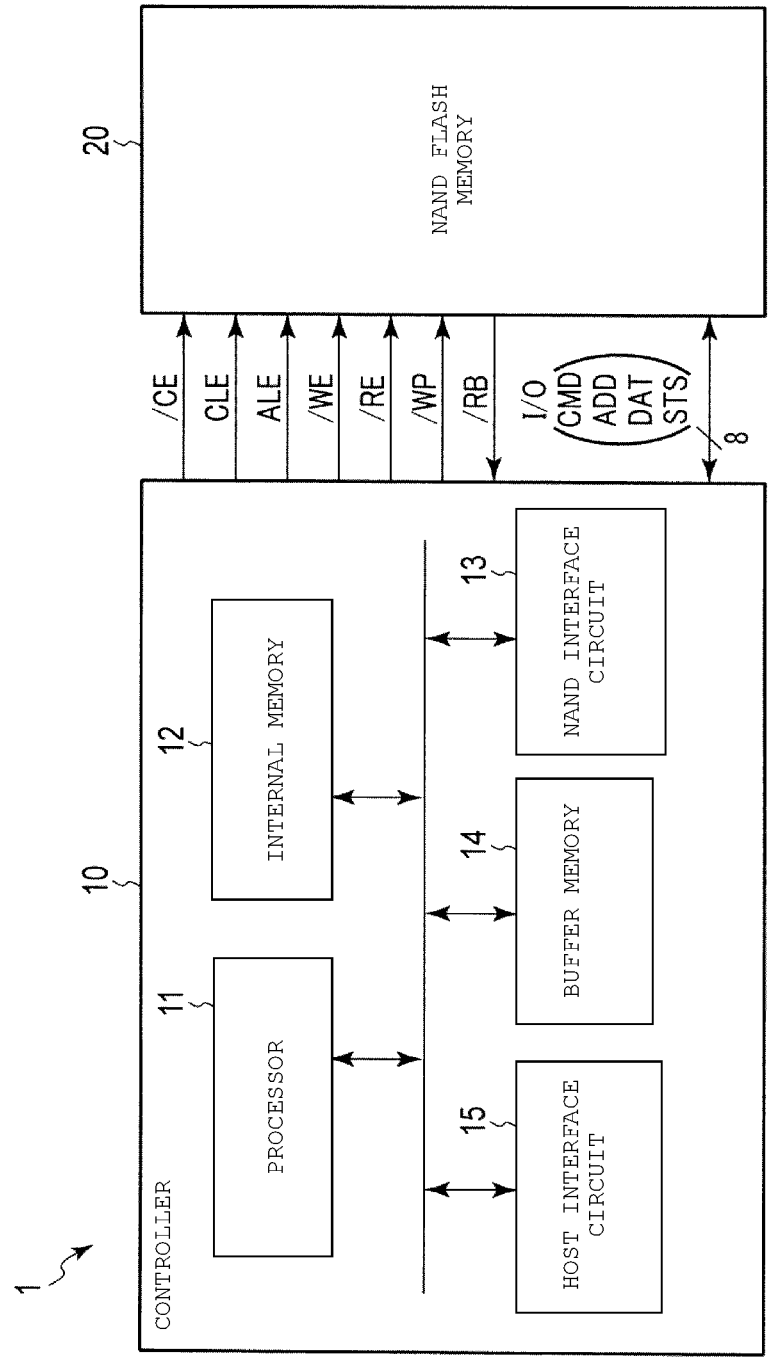
FIG. 1 is a block diagram of a memory system according to a first embodiment.

In the embodiments described below, a read operation is performed using a latch circuit which holds data required to resume an interrupted write operation, and the write operation is resumed.

According to an embodiment, a semiconductor memory device includes memory cells, a sense amplifier unit including a first latch circuit, and a control unit configured to execute read and write operations on the memory cells. The control unit, while executing the write operation on the memory cells, responsive to a write suspend command followed by a read command, performs a data saving operation, the read operation, and a data restoring operation prior to resuming the write operation. The data saving operation includes transferring first data stored in the first latch circuit to an external device, the first data including at least a result of verify operation performed on the memory cells. The data restoring operation includes transferring the first data to the first latch circuit.

Hereinafter, with reference to the drawings, embodiments will be described. In the following description, constituent elements having the same function and configuration are given the same reference numerals. If constituent elements having the same reference numeral are to be differentiated from each other, the constituent elements are differentiated from each other by adding subscripts (or suffixes) to the reference numeral. If the constituent elements do not need to be differentiated from each other, the constituent elements are given the same reference numeral without adding subscripts (or suffixes) to the reference numeral.

1. First Embodiment

A description will be made of a semiconductor memory device according to a first embodiment.

1.1 Configuration

First, a description will be made of a configuration of a semiconductor memory device according to the first embodiment.

1.1.1 Overall Configuration of Memory System

With reference to FIG. 1, a description will be made of a configuration example of a memory system according to the first embodiment. FIG. 1 is a block diagram illustrating an example of a configuration of a memory system according to the first embodiment. A memory system 1 communicates with, for example, an external host device (not illustrated). The memory system 1 holds data from the host device (not illustrated), and reads out data to the host device.

As illustrated in FIG. 1, the memory system 1 includes a controller 10 and a semiconductor memory device (e.g., NAND flash memory) 20. The controller 10 receives a command from the host device, and controls the semiconductor memory device 20 on the basis of the received command. Specifically, the controller 10 writes data which is instructed to be written by the host device to the semiconductor memory device 20, and reads data which is instructed to be read by the host device from the semiconductor memory device 20, and transmits the data to the host device. The controller 10 is connected to the semiconductor memory device 20 via a NAND bus. The semiconductor memory device 20 includes a plurality of memory cells, and stores data in a nonvolatile manner.

The NAND bus performs transmission and reception of signals /CE, CLE, ALE, /WE, /RE, /WP, /RB, and I/O according to a NAND interface. The signal /CE is used to enable the semiconductor memory device 20. The signals CLE and ALE are used to notify the semiconductor memory device 20 that signals I/O flowing toward the semiconductor memory device 20 along with the signal CLE and the signal ALE indicate a command CMD and an address ADD. If both of the signals CLE and ALE have a "low (L)" level, the signals CLE and ALE are used to notify the semiconductor memory device 20 that signals I/O flowing toward the semiconductor memory device 20 along with the signal CLE and the signal ALE indicate data DAT. The signal /WE is used to instruct the semiconductor memory device 20 that a signal I/O flowing toward the semiconductor memory device 20 along with the signal /WE is an input signal into the semiconductor memory device 20. The signal /RE is used to instruct the semiconductor memory device 20 to output a signal I/O. The signal /WP is used to instruct the semiconductor memory device 20 to prohibit data from being written or erased. The signal /RB indicates whether the semiconductor memory device 20 is in a ready state (a state of receiving a command from an external device) or a busy state (a state of not receiving a command from the external device). The signal I/O is, for example, an 8-bit signal. The signal I/O is contains the data which is transmitted and received between the semiconductor memory device 20 and the controller 10, and includes the command CMD, the address ADD, data DAT, and a status STS. The data DAT includes write data and read data.

1.1.2 Configuration of Controller

Next, with reference to FIG. 1, a description will be made of the controller of the memory system according to the first embodiment. The controller 10 includes a processor (e.g., central processing unit (CPU)) 11, an internal memory (e.g., random access memory (RAM)) 12, a NAND interface circuit 13, a buffer memory 14, and a host interface circuit 15.

The processor 11 controls the entire operation of the controller 10. The processor 11 issues a writing command based on the NAND interface to the semiconductor memory device 20, for example, in response to a data writing command received from the host device. This operation is also the same for reading and erasing.

The internal memory 12 is, for example, a semiconductor memory such as a dynamic RAM (DRAM), and is used as a work area of the processor 11. The internal memory 12 holds firmware for managing the semiconductor memory device 20, various management tables, and the like.

The NAND interface circuit 13 is connected to the semiconductor memory device 20 via the NAND bus so as to communicate with the semiconductor memory device 20. The NAND interface circuit 13 transmits the command CMD, the address ADD, and write data to the semiconductor memory device 20 in response to an instruction from the processor 11. The NAND interface circuit 13 receives the status STS and read data from the semiconductor memory device 20.

The buffer memory 14 temporarily holds data or the like received by the controller 10 from the semiconductor memory device 20 and the host device. The buffer memory 14 is also used as, for example, a storage region to which write data transmitted to the semiconductor memory device 20 is temporarily saved.

The host interface circuit 15 is connected to the host device so as to communicate with the host device. The host interface circuit 15 transmits, for example, a command and data received from the host device to the processor 11 and the buffer memory 14, respectively.

1.1.3 Configuration of Semiconductor Memory Device

Figure 2:
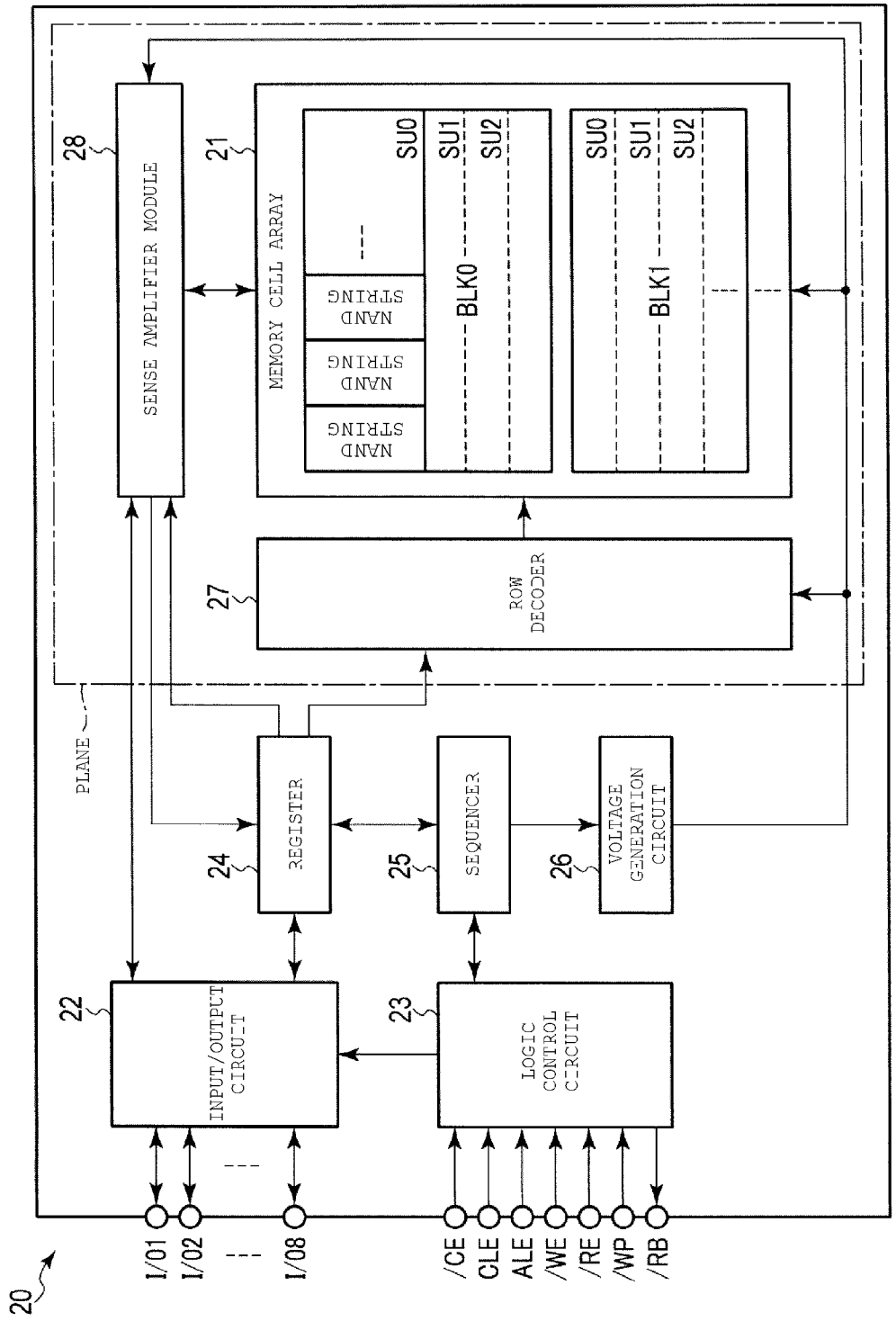
FIG. 2 is a block diagram of a semiconductor memory device according to the first embodiment.

Next, with reference to FIG. 2, a description will be made of a configuration example of the semiconductor memory device according to the first embodiment. FIG. 2 is a block diagram illustrating an example of a configuration of the semiconductor memory device according to the first embodiment.

The semiconductor memory device 20 includes a memory cell array 21, an input/output circuit 22, a logic control circuit 23, a register 24, a sequencer 25, a voltage generation circuit 26, a row decoder 27, and a sense amplifier module 28. The semiconductor memory device 20 includes one plane. The plane includes the memory cell array 21, the row decoder 27, and the sense amplifier module 28. In the example illustrated in FIG. 2, the semiconductor memory device 20 is of a single-plane type including a single plane, but may be of any other type, for example, a multi-plane type including two planes or three or more planes. If two or more planes are included, the semiconductor memory device 20 includes sets of the memory cell arrays 21, the row decoders 27, and the sense amplifier modules 28 of the number corresponding to the number of planes.

The memory cell array 21 includes a plurality of blocks BLK (BLK0, BLK1, . . . ). Each of the blocks BLK includes a plurality of nonvolatile memory cell transistors (not illustrated) associated with word lines and bit lines. The block BLK is, for example, the data erasing unit, and data in the same block BLK is collectively erased. Each block BLK includes a plurality of string units SU (SU0, SU1, SU2, . . . ). Each of the string units SU is an aggregate of NAND strings NS. Each of the NAND strings NS includes a plurality of memory cell transistors. The number of blocks in the memory cell array 21, the number of string units in a single block BLK, and the number of NAND strings in a single string unit SU may be set to any number.

The input/output circuit 22 transmits and receives signals I/O (I/O1 to I/O8) to and from the controller 10. The input/output circuit 22 transmits the command CMD and the address ADD in the signals I/O to the register 24. The input/output circuit 22 transmits and receives write data and read data to and from the sense amplifier module 28. The input/output circuit 22 receives the status STS from the register 24.

The logic control circuit 23 receives the signals /CE, CLE, ALE, /WE, /RE and /WP from the controller 10. The logic control circuit 23 transmits the signal /RB to the controller 10 so as to notify the external device of a state of the semiconductor memory device 20.

The register 24 holds the command CMD and the address ADD. The register 24 transmits the address ADD to the row decoder 27 and the sense amplifier module 28, and transmits the command CMD to the sequencer 25. The register 24 may hold information regarding a threshold voltage level which passed verification during a write operation on the memory cell array 21.

The sequencer 25 receives the command CMD, and controls the entire semiconductor memory device 20 according to a sequence based on the command CMD.

The voltage generation circuit 26 generates voltages required in operations such as writing, reading, and erasing of data on the basis of an instruction from the sequencer 25. The voltage generation circuit 26 supplies the generated voltages to the row decoder 27 and the sense amplifier module 28.

The row decoder 27 receives a row address of the address ADD from the register 24, and selects the block BLK on the basis of the row address. Voltages are transmitted to the selected block BLK from the voltage generation circuit 26 via the row decoder 27.

During reading of data, the sense amplifier module 28 senses read data which is read out to a bit line from a memory cell transistor, and transmits the sensed read data to the input/output circuit 22. During writing of data, the sense amplifier module 28 transmits write data which is to be written to a memory cell transistor via a bit line. The sense amplifier module 28 receives a column address of the address ADD from the register 24, and outputs data of a column based on the column address. Details of the sense amplifier module 28 will be described later.

1.1.4 Configuration of Memory Cell Array

Figure 3:
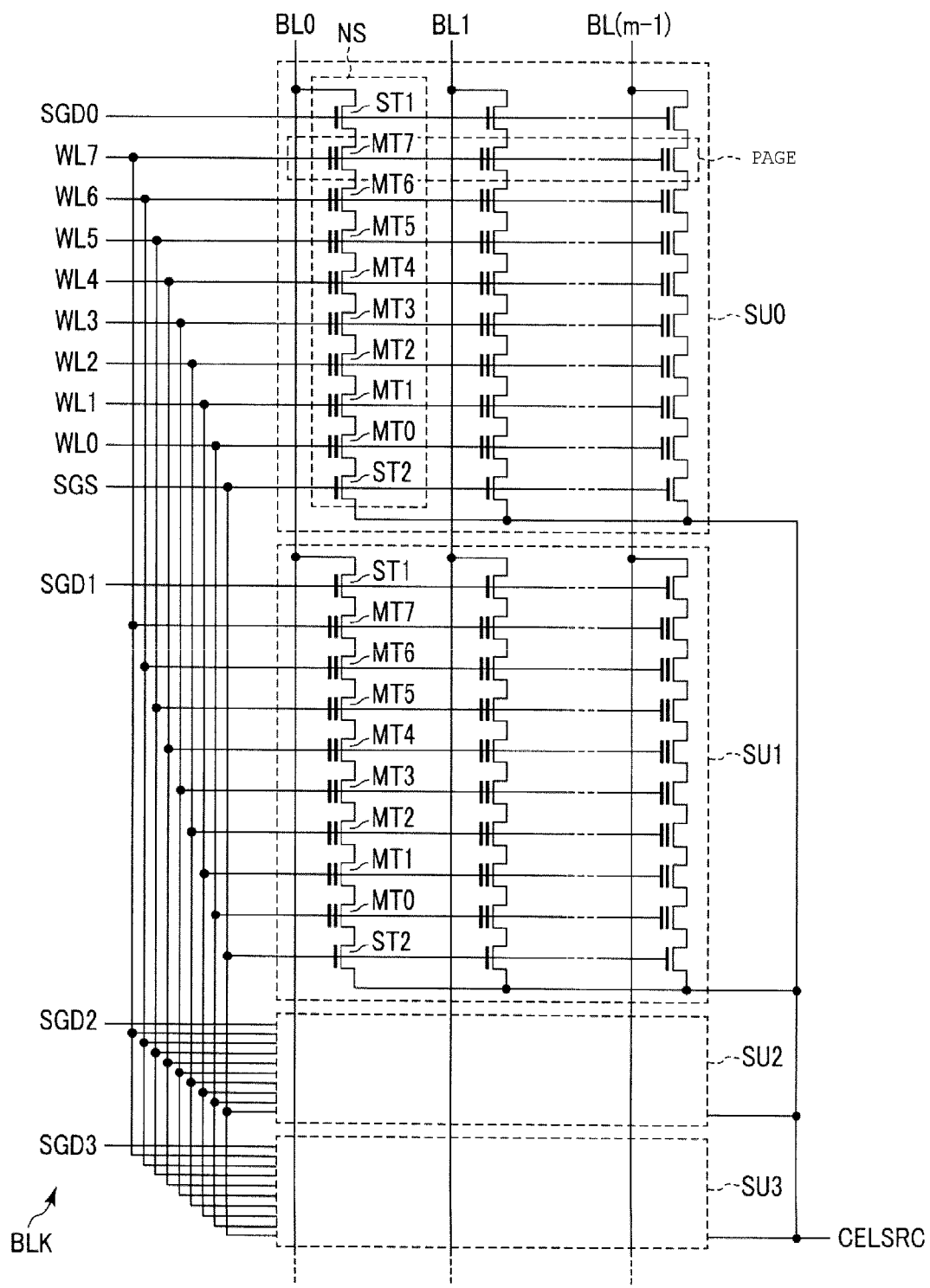
FIG. 3 is a circuit diagram of a memory cell array of the semiconductor memory device according to the first embodiment.

Next, with reference to FIG. 3, a description will be made of a configuration of the memory cell array of the semiconductor memory device according to the first embodiment. FIG. 3 illustrates an example of a circuit diagram of the memory cell array of the semiconductor memory device according to the first embodiment.

As illustrated in FIG. 3, each NAND string NS includes, for example, eight memory cell transistors MT (MT0 to MT7), a select transistor ST1, and a select transistor ST2. Any number of memory cell transistors MT, including eight, may be used, e.g., 16, 32, 64, 128, and the like. Each of the memory cell transistors MT includes a stacked gate configured with a control gate and a charge storage layer. The memory cell transistors MT are connected in series to each other between the select transistors ST1 and ST2. In the following description, the term "connection between elements" also includes the meaning that other conductive elements are interposed between the elements.

In a certain block BLK, gates of the select transistors ST1 of the string units SU0 to SU3 are respectively connected to select gate lines SGD0 to SGD3. Gates of the select transistors ST2 of all of the string units SU in the block BLK are connected in common to a select gate line SGS. Control gates of the memory cell transistors MT0 to MT7 in the same block BLK are respectively connected to word lines WL0 to WL7. In other words, the word line WL having the same address is connected in common to all of the string units SU in the same block BLK, and the select gate line SGS is connected in common to all of the string units SU in the same block BLK. On the other hand, a select gate line SGD is connected to only one of the string units SU in the same block BLK.

In the NAND strings NS disposed in a matrix configuration in the memory cell array 21, the other ends of the select transistors ST1 of the NAND strings NS in the same row are respectively connected tom bit lines BL (BL0 to BL (m−1)) (where m is a natural number). Each of the bit lines BL is connected in common to the NAND strings NS in the same column over a plurality of blocks BLK.

The other ends of the select transistors ST2 are connected to a source line CELSRC. The source line CELSRC is connected in common to a plurality of NAND strings NS over a plurality of blocks BLK.

As described above, erasing of data is collectively performed on, for example, the memory cell transistors MT in the same block BLK. In contrast, reading and writing of data are collectively performed on a plurality of memory cell transistors MT which are connected in common to a certain word line WL in any one of the string units SU of any one of the blocks BLK. The collective writing unit is referred to as a "page". A data size of one page is, for example, 16 kbytes (KB). Reading and writing of data may also be performed on a ½ page (8 KB) or a ¼ page (4 KB). A write operation and a read operation on a data region smaller than one page will be respectively referred to as partial page program (PPP) and partial page read (PPR) in some cases.

Figure 4:
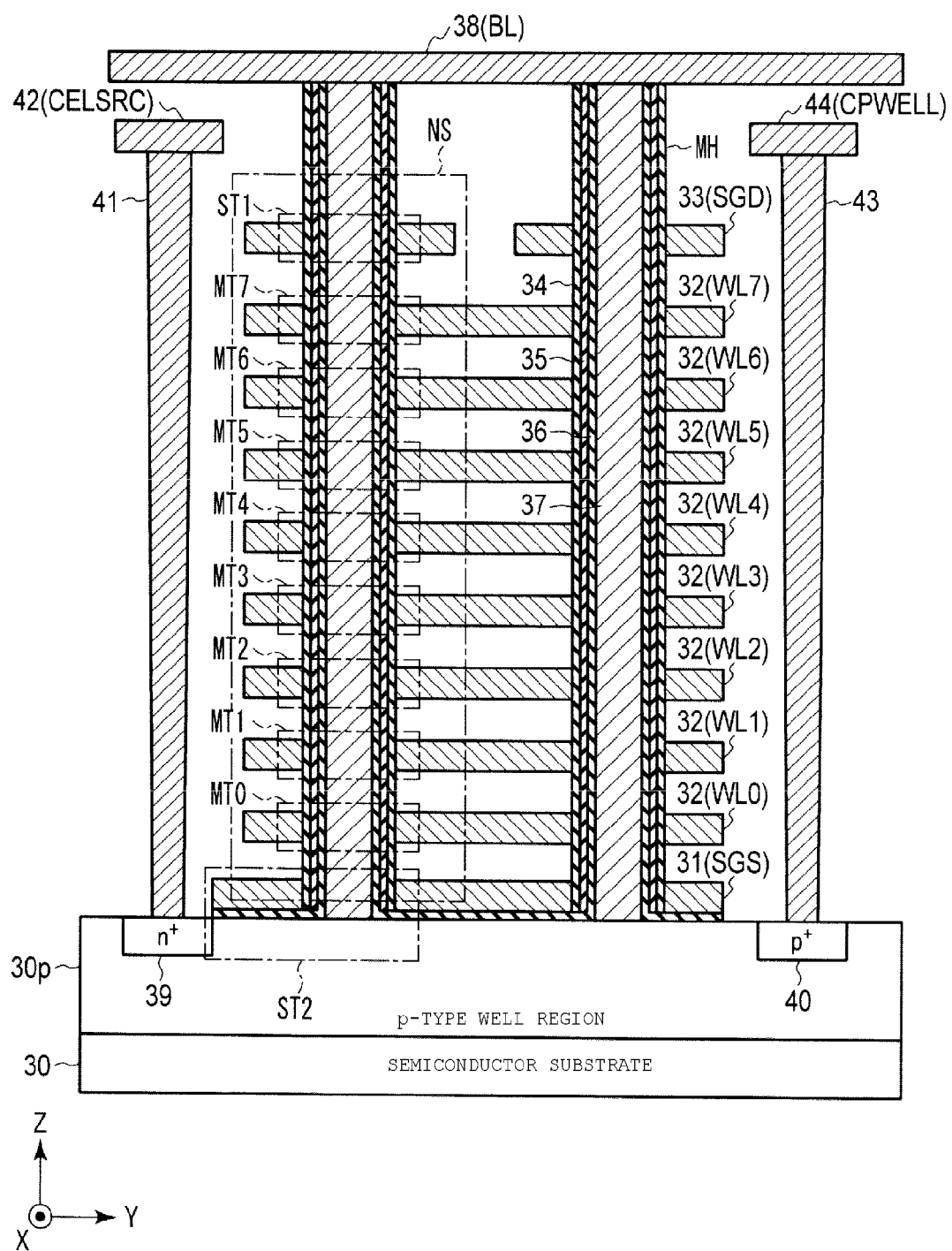
FIG. 4 is a sectional view of the memory cell array of the semiconductor memory device according to the first embodiment.

Next, with reference to FIG. 4, a description will be made of a sectional structure of the memory cell array 21. FIG. 4 illustrates an example of a sectional structure of a part of the memory cell array of the semiconductor memory device according to the first embodiment. Particularly, FIG. 4 illustrates a portion regarding two string units SU of a single block BLK. Specifically, FIG. 4 illustrates two NAND strings NS of two string units SU, and a peripheral portion thereof. The configuration illustrated in FIG. 4 is arranged in plurality in an X direction, and a set of a plurality of NAND strings NS arranged in the X direction correspond to a single string unit SU.

The semiconductor memory device 20 is provided on a semiconductor substrate 30. In the following description, a plane which is parallel to a surface of the semiconductor substrate 30 is referred to as an XY plane, and a direction perpendicular to the XY plane is referred to as a Z direction. The X direction and the Y direction are orthogonal to each other.

A p-type well region 30p is provided in an upper surface of the semiconductor substrate 30. A plurality of NAND strings NS are provided on the p-type well region 30p. In other words, for example, a wiring layer 31 which functions as the select gate line SGS, eight wiring layers 32 (WL0 to WL7) which function as word lines WL0 to WL7, and a wiring layer 33 which functions as the select transistor SGD, are sequentially stacked on the p-type well region 30p. Each of the wiring layers 31 and 33 may include a plurality of stacked wiring layers. Insulating films (not illustrated) are provided between the stacked wiring layers 31 to 33.

The wiring layer 31 is connected in common to, for example, the gates of the select transistors ST2 of all the NAND strings NS in a single block BLK. Each of the wiring layers 32 is connected in common to the control gates of different memory cell transistors MT in a single block BLK. The wiring layer 33 is connected in common to the gates of the select transistors ST1 of all the NAND strings NS in a single string unit SU.

A memory hole MH is provided to pass through the wiring layers 33, 32 and 31 and reach the p-type well region 30p. A block insulating film 34, a charge storage layer (insulating film) 35, and a tunnel oxide film 36 are provided in this order on a side surface of the memory hole MH. A semiconductor pillar 37 is embedded in the memory hole MH. The semiconductor pillar 37 is, for example, undoped polysilicon, and functions as a current path of the NAND string NS. A wiring layer 38 which functions as the bit line BL is provided on an upper end of the semiconductor pillar 37.

As mentioned above, the select transistor ST2, the plurality of memory cell transistors MT, and the select transistor ST1 are stacked in this order over the p-type well region 30p, and a single memory hole MH corresponds to a single NAND string NS.

An $n^+$-type impurity diffusion region 39 and a $p^+$-type impurity diffusion region 40 are provided in a surface of the p-type well region 30p. A contact plug 41 is provided on an upper surface of the $n^+$-type impurity diffusion region 39. A wiring layer 42 which functions as the source line CELSRC is provided on an upper surface of the contact plug 41. A contact plug 43 is provided on an upper surface of the $p^+$-type impurity diffusion region 40. A wiring layer 44 which functions as a well line CPWELL is provided on an upper surface of the contact plug 43.

Other configurations may be employed as a configuration of the memory cell array 21. Such other configurations are disclosed in, for example, U.S. patent application Ser. No. 12/407,403, filed on Mar. 19, 2009, entitled "THREE DIMENSIONAL STACKED NONVOLATILE SEMICONDUCTOR MEMORY," U.S. patent application Ser. No. 12/406,524, filed on Mar. 18, 2009, entitled "THREE DIMENSIONAL STACKED NONVOLATILE SEMICONDUCTOR MEMORY," U.S. patent application Ser. No. 12/679,991, filed on Mar. 25, 2010, entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, entitled "SEMICONDUCTOR MEMORY AND METHOD FOR MANUFACTURING SAME." The entire contents of these patent applications are incorporated by reference in the present application.

1.1.5 Threshold Voltage Distribution in Memory Cell Transistor

Figure 5:
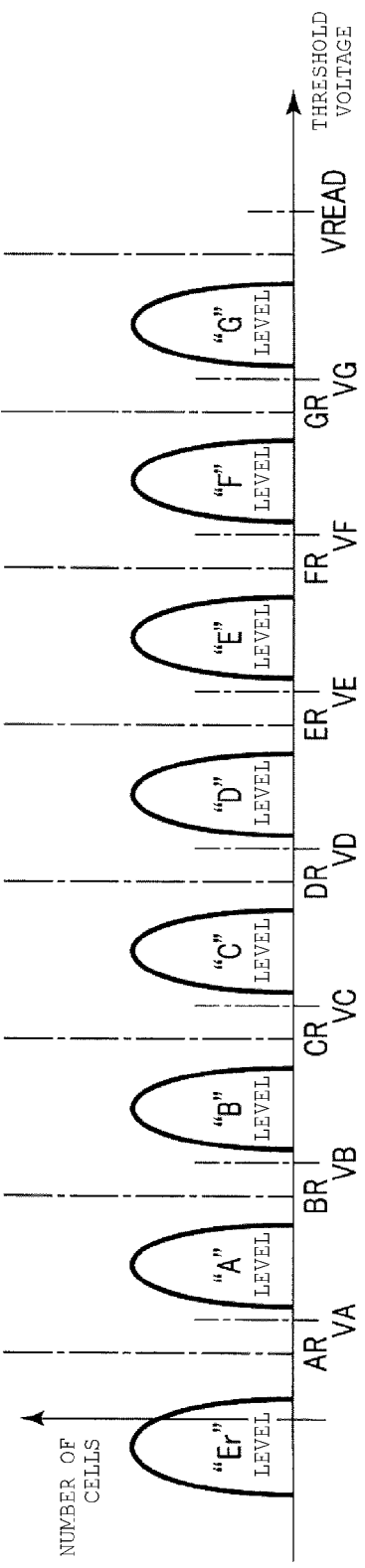
FIG. 5 is a diagram illustrating threshold voltage distributions in a memory cell transistor of the semiconductor memory device according to the first embodiment.

Next, with reference to FIG. 5, a description will be made of a distribution of threshold voltages of the memory cell transistor MT. FIG. 5 is a diagram illustrating an example distribution of threshold voltages of the memory cell transistor of the semiconductor memory device according to the first embodiment.

As illustrated in FIG. 5, a threshold voltage of the memory cell transistor MT can hold 3-bit data including an upper bit (upper data), a middle bit (middle data), and a lower bit (lower data), that is, data of "111", "110", "100", "000", "010", "011", "001", and "101". In FIG. 5, data held in the memory cell transistor MT is 3-bit data, but is not limited thereto, and the memory cell transistor MT may hold data of arbitrary bits such as 2-bit data or 4-bit or more data.

A threshold voltage indicated by "111" data has an "Er" level, and corresponds to, for example, a data erasing state. The threshold voltage having the "Er" level is lower than a voltage AR, and has a positive or negative value.

Threshold voltages indicated by "110", "100", "000", "010", "011", "001", and "101" data respectively have "A", "B", "C", "D", "E", "F", and "G" levels. The "A" level to the "G" level corresponds to a state in which electric charge is injected into the charge storage layer 45, and thus data is written into the memory cell transistor MT. A threshold voltage included in each distribution has, for example, a positive value. A threshold voltage having the "A" level is higher than a verification voltage VA which is higher than a reading voltage AR and is lower than a reading voltage BR.

A threshold voltage having the "B" level is higher than a verification voltage VB which is higher than the reading voltage BR and is lower than a reading voltage CR. A threshold voltage having the "C" level is higher than a verification voltage VC which is higher than the reading voltage CR and is lower than a reading voltage DR. A threshold voltage having the "D" level is higher than a verification voltage VD which is higher than the reading voltage DR and is lower than a reading voltage ER. A threshold voltage having the "E" level is higher than a verification voltage VE which is higher than the reading voltage ER and is lower than a reading voltage FR. A threshold voltage having the "F" level is higher than a verification voltage VF which is higher than the reading voltage FR and is lower than a reading voltage GR. A threshold voltage having the "G" level is higher than a verification voltage VG which is higher than the reading voltage GR and is lower than a voltage VREAD. The voltage VREAD is applied to a word line WL which is not a reading target during reading of data in a certain block BLK.

As mentioned above, each memory cell transistor MT has any one of the eight threshold voltage distributions, and can thus have states of eight types. A relationship between data and a threshold value level is not limited to the above description, and may be changed as appropriate.

As described above, writing and reading of data are performed in units of the page. In this case, page of data written and read may consist of lower bits, for middle bits, or upper bits. Therefore, if the memory cell transistors MT hold 3-bit data, data corresponding to an upper bit, a middle bit, and a lower bit are each allocated to a single page. In the following description, pages which are collectively written or read with respect to an upper bit, a middle bit, and a lower bit will be respectively referred to as an upper page, a middle page, and a lower page.

1.1.6 Configuration of Sense Amplifier Module

Figure 6:
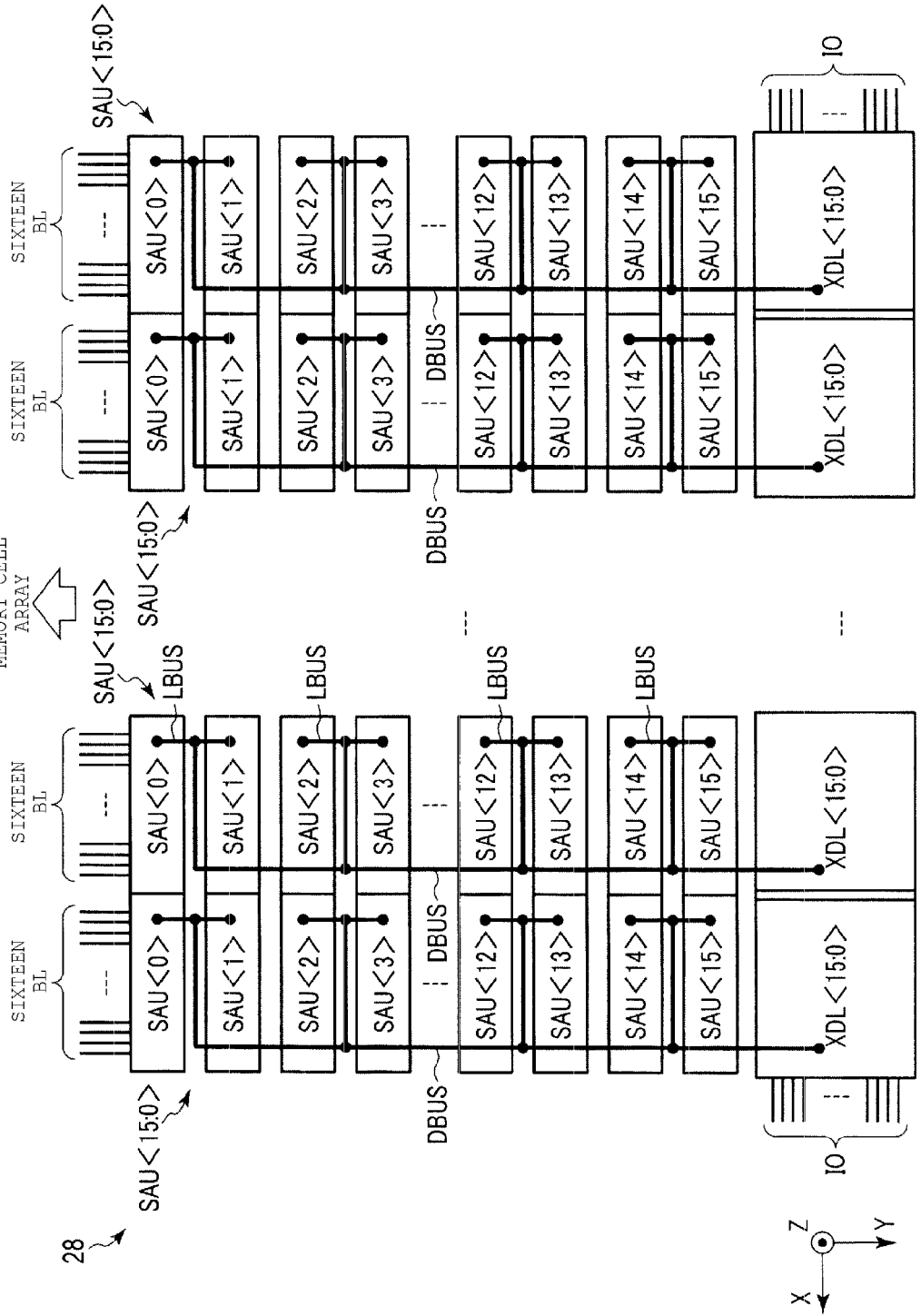
FIG. 6 is a diagram illustrating a sense amplifier module of the semiconductor memory device according to the first embodiment.

Next, a description will be made of a configuration of the sense amplifier module of the semiconductor memory device according to the first embodiment. FIG. 6 is a diagram illustrating an example of a configuration of the sense amplifier module of the semiconductor memory device according to the first embodiment. As illustrated in FIG. 6, the sense amplifier module 28 includes a plurality of sense amplifier unit groups SAU<15:0> and a plurality of latch circuit groups XDL<15:0>.

The plurality of sense amplifier unit groups SAU<15:0> are arranged along the X direction. In the example illustrated in FIG. 6, each of the sense amplifier unit groups SAU<15:0> includes sixteen sense amplifier units SAU (SAU<0>, SAU<1>, . . . , and SAU<15>) arranged along the Y direction.

The sense amplifier units SAU are respectively provided to correspond to, for example, the bit lines BL. Each of the sense amplifier units SAU senses data read out to a corresponding bit line BL, and transmits write data to a corresponding bit line BL. The sense amplifier units SAU are connected to a bus LBUS. Two sense amplifier units SAU (e.g., SAU<0> and SAU<1>, SAU<2> and SAU<3>, . . . ) in each of the sense amplifier unit groups SAU<15:0> are connected to each other via the bus LBUS which is connected thereto. The respective sense amplifier units SAU in the sense amplifier unit group SAU<15:0> are connected in common to a single bus DBUS via the buses LBUS connected thereto.

The latch circuit groups XDL<15:0> are arranged along the X direction. Each of the latch circuit groups XDL<15:0> includes sixteen latch circuits XDL (XDL<0>, XDL<1>, . . . , and XDL<15>). The latch circuit groups XDL<15:0> are provided respectively for the sense amplifier unit groups SAU<15:0>. Sixteen latch circuits XDL<0> to XDL<15> respectively corresponding to the sixteen sense amplifier units SAU<0> to SAU<15> are connected in common to the single bus DBUS. Each latch circuit XDL temporarily holds data related to the signal of the bit line BL connected to the corresponding sense amplifier unit SAU. The respective latch circuits XDL are connected to wirings IO for transmitting the signals I/O. The latch circuits XDL are used to perform transmission and reception of data between the sense amplifier units SAU and an external device via the wirings IO, the bus DBUS, and the bus LBUS. Specifically, data received from the controller 10 is held in the latch circuits XDL via the wirings IO, and is then transmitted to the sense amplifier units SAU via the bus DBUS and the bus LBUS. Data transmitted from the sense amplifier units SAU is held in the latch circuits XDL via the bus LBUS and the bus DBUS, and is then readout to the controller 10 via the wirings IO.

In a read operation on one page (16 KB), the plurality of sense amplifier unit groups SAU<15:0> and the plurality of latch circuit groups XDL<15:0> are all driving targets. In a read operation on a ½ page (8 KB) or a ¼ page (4 KB), a half or a quarter of the plurality of sense amplifier unit groups SAU<15:0> and the plurality of latch circuit groups XDL<15:0> are driving targets.

Specifically, in a read operation on a ½ page, either the even-numbered sense amplifier units SAU<e> (SAU<0>, SAU<2>, . . . , and SAU<14>) or the odd-numbered sense amplifier units SAU<o> (SAU<1>, SAU<3>, . . . , and SAU<15>) arranged in the Y direction are driving targets. This is also the same for the latch circuits XDL.

For example, in a read operation on a ¼ page, a half of the sense amplifier units SAU<e> (sense amplifier units SAU<e1> or SAU<e2>) or a half of the sense amplifier units SAU<o> (sense amplifier units SAU<o1> or SAU<o2>), that is, the sense amplifier units SAU corresponding to one of the four types are driving targets. The sense amplifier units SAU<e1> include, for example, SAU<0>, SAU<4>, SAU<8>, and SAU<12>. The sense amplifier units SAU<e2> include, for example, SAU<2>, SAU<6>, SAU<10>, and SAU<14>. The sense amplifier units SAU<o1> include, for example, SAU<1>, SAU<5>, SAU<9>, and SAU<13>. The sense amplifier units SAU<o2> include, for example, SAU<3>, SAU<7>, SAU<11>, and SAU<15>. This is also the same for the latch circuits XDL. For particular differentiation, constituent elements in the sense amplifier units SAU<e> and SAU<o>, or SAU<e1>, SAU<o1>, SAU<e2>, and SAU<o2> are respectively given suffixes <e> and <o>, or <e1>, <o1>, <e2>, and <o2> so as to be differentiated from each other.

The above-described allocation of driving targets is only an example, and any other allocation may be employed. In the following description, the description will be made assuming that the sense amplifier units SAU and the latch circuits XDL used to read data less than one page are driven on the basis of the above-described allocation.

Figure 7:
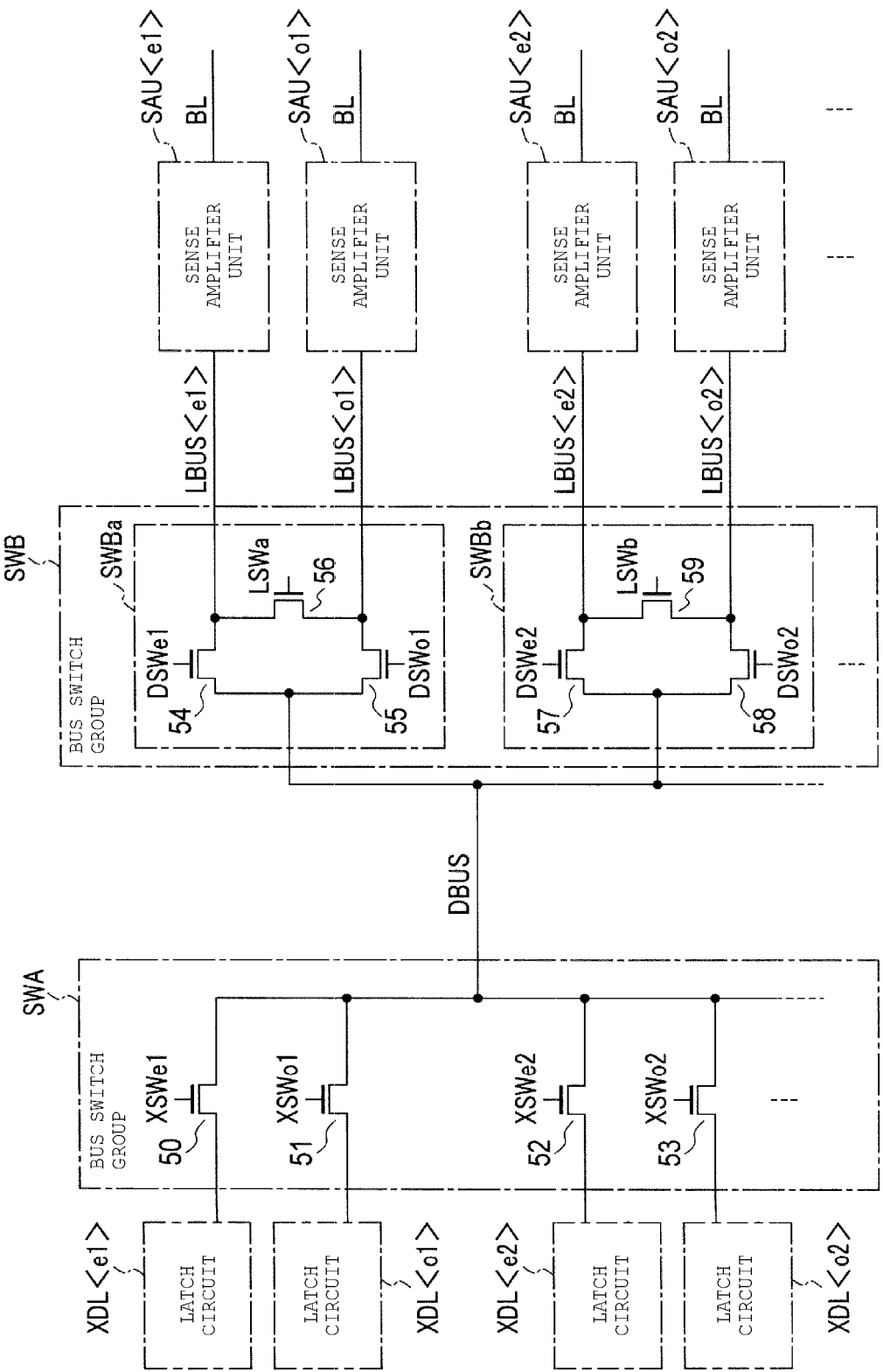
FIG. 7 is a circuit diagram of the sense amplifier module of the semiconductor memory device according to the first embodiment.

Next, with reference to FIG. 7, a description will be made of connection between the latch circuit groups and the sense amplifier unit groups of the semiconductor memory device according to the first embodiment. FIG. 7 is a circuit diagram illustrating connections between the latch circuit groups and the sense amplifier unit groups of the semiconductor memory device according to the first embodiment. Overall, FIG. 7 illustrates a connection relationship among four latch circuits XDL<e1>, XDL<o1>, XDL<e2>, and XDL<o2>, and four sense amplifier units SAU<e1>, SAU<o1>, SAU<e2>, and SAU<o2>. Other four latch circuits XDL and other four sense amplifier units SAU have the same connection relationship as in FIG. 7.

As illustrated in FIG. 7, a bus switch group SWA are provided between the latch circuit groups XDL<15:0> (XDL<e1>, XDL<o1>, XDL<e2>, XDL<o2>, . . . ) and the bus DBUS and includes, for example, transistors 50 to 53. Signals XSWe1, XSWo1, XSWe2 and XSWo2 are respectively input to gates of the transistors 50 to 53. The latch circuits XDL<e1>, XDL<o1>, XDL<e2> and XDL<o2> are connected in common to the bus DBUS via the transistors 50 to 53, respectively.

A bus switch group SWB is provided between the bus DBUS and the sense amplifier unit groups SAU<15:0> (SAU<e1>, SAU<o1>, SAU<e2>, SAU<o2>, . . . ) and includes, for example, bus switch groups SWBa and SWBb.

The bus switch group SWBa includes, for example, transistors 54 to 56. A signal DSWe1 is input to a gate of the transistor 54 which has one end connected to the bus DBUS and the other end connected to the sense amplifier unit SAU<e1> via the bus LBUS<e1>. A signal DSWo1 is input to a gate of the transistor 55 which has one end connected to the bus DBUS and the other end connected to the sense amplifier unit SAU<o1> via the bus LBUS<o1>. The transistor 56 has a gate to which a signal LSWa is input, and is connected between the bus LBUS<e1> and the bus LBUS<o1>.

The bus switch group SWBb includes, for example, transistors 57 to 59. A signal DSWe2 is input to a gate of the transistor 57 which has one end connected to the bus DBUS and the other end connected to the sense amplifier unit SAU<e2> via the bus LBUS<e2>. A signal DSWo2 is input to a gate of the transistor 58 which has one end connected to the bus DBUS and the other end connected to the sense amplifier unit SAU<o2> via the bus LBUS<o2>. The transistor 59 has a gate to which a signal LSWb is input, and is connected between the bus LBUS<e2> and the bus LBUS<o2>.

With this connection, data can be transmitted from each of the latch circuits XDL<e1>, XDL<o1>, XDL<e2> and XDL<o2> to any one of the sense amplifier units SAU<e1>, SAU<o1>, SAU<e2> and SAU<o2> via the bus DBUS. Data can be transmitted between the sense amplifier units SAU<e1> and SAU<o1> without using the bus DBUS (via the bus LBUS<e1> and the bus LBUS<o1>). Data can be transmitted between the sense amplifier unit SAU<e1> or SAU<o1>, and the sense amplifier unit SAU<e2> or SAU<o2> via the bus DBUS.

1.1.7 Configuration of Sense Amplifier Unit

Figure 8:
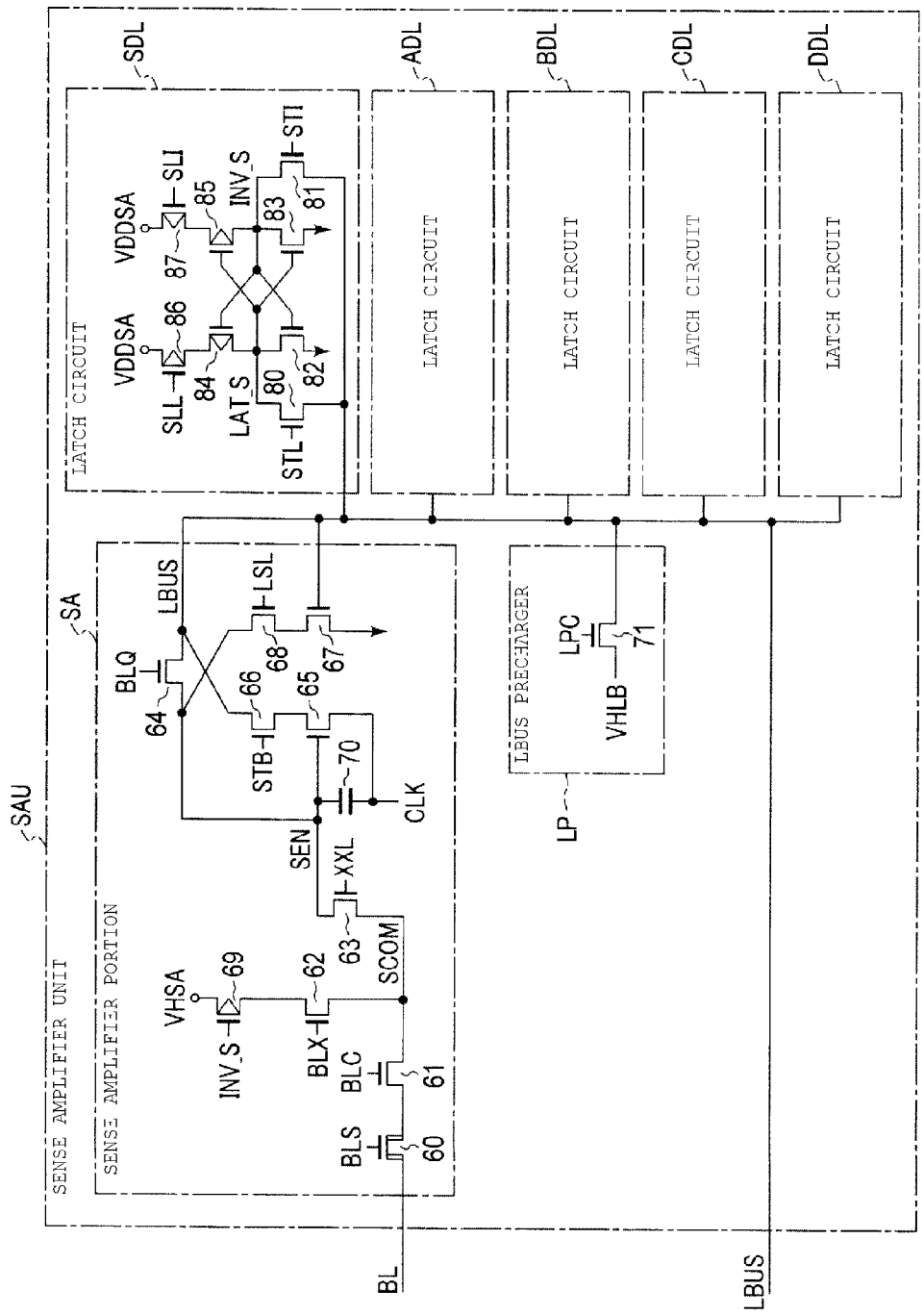
FIG. 8 is a circuit diagram of a sense amplifier unit of the semiconductor memory device according to the first embodiment.

Next, a description will be made of a configuration of the sense amplifier unit of the semiconductor memory device according to the first embodiment. FIG. 8 is a circuit diagram illustrating an example of a configuration of the sense amplifier unit of the semiconductor memory device according to the first embodiment.

As illustrated in FIG. 8, the sense amplifier unit SAU includes a sense amplifier portion SA, five latch circuits SDL, ADL, BDL, CDL and DDL, and an LBUS precharger LP. The sense amplifier unit SAU is connected to the bus LBUS and the bit line BL.

The sense amplifier portion SA includes a high breakdown voltage n-channel MOS transistor 60, low breakdown voltage n-channel MOS transistors 61 to 68, a low breakdown voltage p-channel MOS transistor 69, and a capacitor element 70. In the following description, the high breakdown voltage n-channel MOS transistor, the low breakdown voltage n-channel MOS transistor, and the low breakdown voltage p-channel MOS transistor will be simply referred to as transistors if the transistors are not differentiated from each other.

The transistor 60 has a gate to which a signal BLS is input, one end connected to the corresponding bit line BL, and the other end connected to one end of the transistor 61.

The transistor 61 has a gate to which a signal BLC is input, and the other end connected to a node SCOM. The transistor 61 clamps the corresponding bit line BL to a potential in accordance with the signal BLC.

The transistor 62 has a gate to which a signal BLX is input, one end connected to the node SCOM, and the other end connected to one end of the transistor 69.

The transistor 63 has a gate to which a signal XXL is input, one end connected to the node SCOM, and the other end connected to a node SEN.

The transistor 64 has a gate to which a signal BLQ is input, one end connected to the node SEN, and the other end connected to the bus LBUS.

The transistor 65 has a gate connected to the node SEN, one end to which a clock CLK is input, and the other end connected to one end of the transistor 66. The transistor 66 has a gate to which a signal STB is input, and the other end connected to the bus LBUS.

The transistor 67 has a gate connected to the bus LBUS, one end connected to the ground, and the other end connected to one end of the transistor 68. The transistor 68 has a gate to which a signal LSL is input, and the other end connected to the node SEN.

The transistor 69 has a gate connected to a node INV_S, and the other end to which a voltage VHSA is applied.

The capacitor element 70 has one electrode connected to the node SEN, and the other electrode to which the clock CLK is input.

The sense amplifier portion SA controls the bit line BL according to data held in the latch circuit SDL. The latch circuits SDL, ADL, BDL, CDL and DDL temporarily hold write data and read data. In a data read operation, the latch circuits SDL, ADL, BDL, CDL and DDL may temporarily hold not only read data which is read out to the controller 10 but also data which is generated during data reading. In a data write operation, the other latch circuits ADL, BDL, CDL and DDL are used for multi-value operations, for example, when each memory cell transistor MT holds data of 2 bits or more.

The latch circuit SDL includes low breakdown voltage n-channel MOS transistors 80 to 83, and low breakdown voltage p-channel MOS transistors 84 to 87.

The transistor 80 has a gate to which a signal STL is input, one end connected to the bus LBUS, and the other end connected to a node LAT_S.

The transistor 81 has a gate to which a signal STI is input, one end connected to the bus LBUS, and the other end connected to the node INV_S.

The transistor 82 has a gate connected to the node INV_S, one end connected to the ground, and the other end connected to the node LAT_S.

The transistor 83 has a gate connected to the node LAT_S, one end connected to the ground, and the other end connected to the node INV_S.

The transistor 84 has a gate connected to node INV_S, one end connected to the node LAT_S, and the other end connected to one end of the transistor 86.

The transistor 85 has a gate connected to node LAT_S, one end connected to the node INV_S, and the other end connected to one end of the transistor 87.

The transistor 86 has a gate to which a signal SLL is input, and the other end to which a voltage VDDSA is applied.

The transistor 87 has a gate to which a signal SLI is input, and the other end to which the voltage VDDSA is applied.

In the latch circuit SDL, the transistors 82 and 84 form a first inverter, and the transistors 83 and 85 form a second inverter. An output terminal of the first inverter and an input terminal of the second inverter, LAT_S, are connected to the bus LBUS via the data transmission transistor 80. An input terminal of the first inverter and an output terminal of the second inverter, INV_S, are connected to the bus LBUS via the data transmission transistor 81. The latch circuit SDL holds data at the node LAT_S and holds inverting data thereof at the node INV_S.

The latch circuits ADL, BDL, CDL and DDL have the same configuration as, for example, the configuration of the latch circuit SDL, and thus a description thereof will be omitted. In each sense amplifier unit SAU, the sense amplifier portion SA is connected to the five latch circuits SDL, ADL, BDL, CDL and DDL via the bus LBUS so that data can be transmitted and received therebetween.

Details of data transmission and reception between latch circuits in the sense amplifier unit SAU are disclosed in, for example, U.S. patent application Ser. No. 14/862,412, filed on Sep. 12, 2013, entitled "NONVOLATILE SEMICONDUCTOR MEMORY DEVICE," which is incorporated by reference herein in its entirety.

The LBUS precharger LP includes, for example, a low breakdown voltage n-channel MOS transistor 71. The transistor 71 has a gate to which a signal LPC is input, one end connected to the bus LBUS, and the other end to which a voltage VHLB is applied. The LBUS precharger LP transmits the voltage VHLB to the bus LBUS, so that the bus LBUS is precharged.

The various signals in the sense amplifier unit SAU having the above-described configuration are given by, for example, the sequencer 25.

1.2 Operation

Next, a description will be made of an operation of the semiconductor memory device according to the first embodiment.

1.2.1 Summary of Write Operation Interrupted by Read Operation

Figure 9:
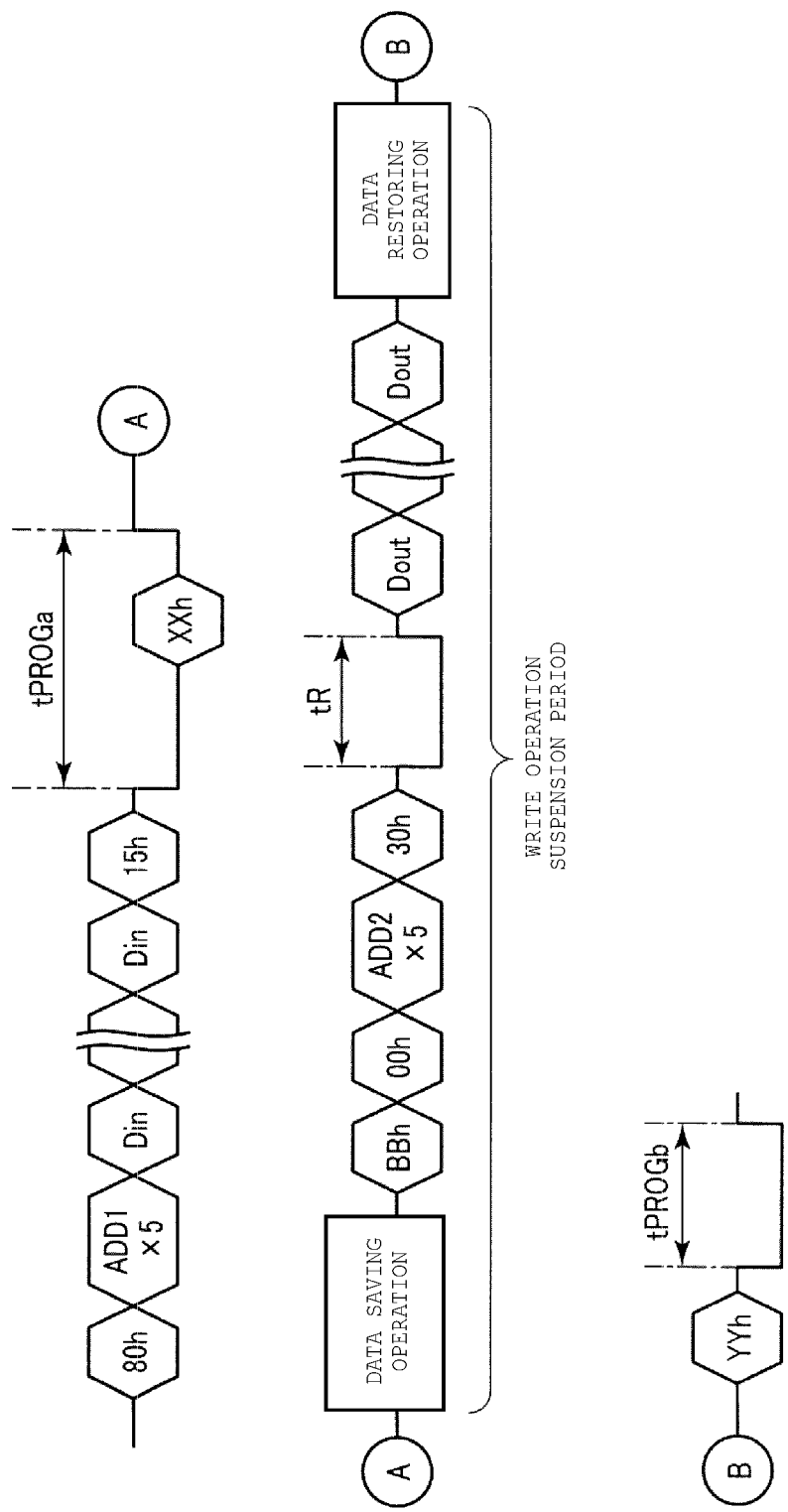
FIG. 9 is a command sequence for a write operation interrupted by a read operation for the semiconductor memory device according to the first embodiment.

A description will be made of a summary of a write operation interrupted by a read operation for the semiconductor memory device according to the first embodiment. FIG. 9 is a command sequence for a write operation interrupted by a read operation for the semiconductor memory device according to the first embodiment. As illustrated in FIG. 9, the command sequence includes a write operation suspension period that starts with a data saving operation and ends with a data restoring operation. A read operation is interrupted and performed in the write operation suspension period.

The controller 10 issues a command "80h", and transmits the command to the semiconductor memory device 20. The writing command "80h" is used to instruct the semiconductor memory device 20 to perform data writing.

The controller 10 issues an address ADD1, for example, over five cycles, and transmits the address ADD1 to the semiconductor memory device 20. The address ADD1 is used to designate an address of a certain region in a writing target block BLK. Next, the controller 10 transmits write data Din to the semiconductor memory device 20. The controller 10 issues a command "15h" and transmits the command to the semiconductor memory device 20. The command "15h" is used to cause the semiconductor memory device 20 to perform data writing on the basis of the address ADD1 and the write data Din which are transmitted immediately before. If there is a latch circuit which is not used for a write operation, the command "15h" is used to write some write data of the next page into the latch circuit which is not used. Such a writing method is also referred to as a cache program, and write data of the next page which is previously written into the latch circuit is also referred to as cache data.

If the command "15h" is stored in the register 24, the sequencer 25 controls the voltage generation circuit 26, the row decoder 27, the sense amplifier module 28, and the like, so as to start a write operation. At this time, the logic control circuit 23 sets the signal /RB to an "L" level so as to notify the controller 10 that the semiconductor memory device 20 is in a busy state. A period tPROGa in which the semiconductor memory device 20 is in a busy state indicates a period in which the write operation is performed before the write operation suspension period.

The controller 10 issues a suspension command "XXh" and transmits the command to the semiconductor memory device 20 in the period tPROGa. The command "XXh" is used to instruct the semiconductor memory device 20 to suspend the current data write operation. If the command "XXh" is stored in the register 24, the sequencer 25 suspends the data write operation. After the write operation is suspended, the logic control circuit 23 sets the signal /RB to an "H" level so as to notify the controller 10 that the semiconductor memory device 20 is in a ready state.

Next, the controller 10 causes the semiconductor memory device 20 to perform a data saving operation. Specifically, the sequencer 25 saves some data held in the latch circuits SDL, ADL, BDL, CDL, DDL and XDL of the sense amplifier module 28 to which data read out in the subsequent read operation is stored in response to an instruction from the controller 10. Consequently, among the latch circuits SDL, ADL, BDL, CDL, DDL and XDL, a plurality of latch circuits transition to an overwritable state, so that the subsequent read operation can be performed using the latch circuits in an overwritable state. Details of the data saving operation will be described later.

After the data saving operation is completed, the controller 10 issues a prefix command "BBh" and a reading command "00h" and transmits the commands to the semiconductor memory device 20. The command "00h" is used to instruct the semiconductor memory device 20 to read normal read data. If the command "BBh" and the command "00h" are consecutively received, the semiconductor memory device 20 recognizes that a special read operation is instructed to be performed. The command "BBh" is used to also designate the type of special read operation.

The special read operation includes a read operation in which data is required to be held in a plurality of latch circuits as a work region during the read operation. An example of the special read operation may include a read operation in which, for example, data in a memory cell transistor MT adjacent to a memory cell transistor MT from which data is to be read is read in advance, and the data read from the target memory cell transistor MT is corrected on the basis of the data which is read in advance. There may be a read operation in which data is read from the memory cell transistor MT in a certain page by using a plurality of reading voltages, and an optimal reading voltage for reading a lot of data accurately is searched for.

Details of these two special read operations are disclosed in U.S. patent application Ser. No. 14/645,740, filed on Mar.

17, 2016, entitled "semiconductor memory device," which is incorporated by reference in the present application in its entirety.

The controller 10 issues an address ADD2, for example, over five cycles, and transmits the address ADD2 to the semiconductor memory device 20. The address ADD2 is used to designate an address of a certain region as a reading target, and is different from, for example, the address ADD1 designated in the write operation. The controller 10 issues a command "30h" and transmits the command to the semiconductor memory device 20. The command "30h" is used to cause the semiconductor memory device 20 to read data on the basis of the address ADD2 transmitted immediately before.

If the command "30h" is stored in the register 24, the sequencer 25 controls the voltage generation circuit 26, the row decoder 27, the sense amplifier module 28, and the like, so as to start a write operation. At this time, the logic control circuit 23 sets the signal /RB to an "L" level so as to notify the controller 10 that the semiconductor memory device 20 is in a busy state. A period tR in which the semiconductor memory device 20 is in a busy state indicates a period in which the read operation is performed. In the period tR, the data read from the semiconductor memory device 20, and intermediate data (also referred to as read option data) generated during reading of the data are held in any one of the plurality of latch circuits SDL, ADL, BDL, CDL, DDL and XDL of the sense amplifier module 28.

After the read operation is completed, the logic control circuit 23 sets the signal /RB to an "H" level so as to notify the controller 10 that the semiconductor memory device 20 is in a ready state. Next, the input/output circuit 22 outputs data Dout read by the sense amplifier module 28 to the controller 10 via the latch circuits XDL.

Next, the controller 10 causes the semiconductor memory device 20 to perform a data restoring operation for returning the saved data to an original location. Specifically, in response to an instruction from the controller 10, the sequencer 25 causes some of the data saved from the latch circuits of the sense amplifier module 28, to be held again in the latch circuits which held the data before the data saving operation. Consequently, a state before the data read operation is performed can be restored, and thus the suspended write operation can be resumed. Details of the data restoring operation will be described later.

The controller 10 issues a resuming command "YYh" and transmits the command to the semiconductor memory device 20. The command "YYh" is used to instruct the suspended write operation to be resumed. If the command "YYh" is stored in the register 24, the sequencer 25 resumes the write operation.

At this time, the logic control circuit 23 sets the signal /RB to an "L" level so as to notify the controller 10 that the semiconductor memory device 20 is in a busy state. A period tPROGb in which the semiconductor memory device 20 is in a busy state indicates a period in which the resumed write operation is performed.

After the write operation is completed, the logic control circuit 23 sets the signal /RB to an "H" level so as to notify the controller 10 that the semiconductor memory device 20 is in a ready state.

As mentioned above, the write operation interrupted by the read operation is finished.

Figure 10:
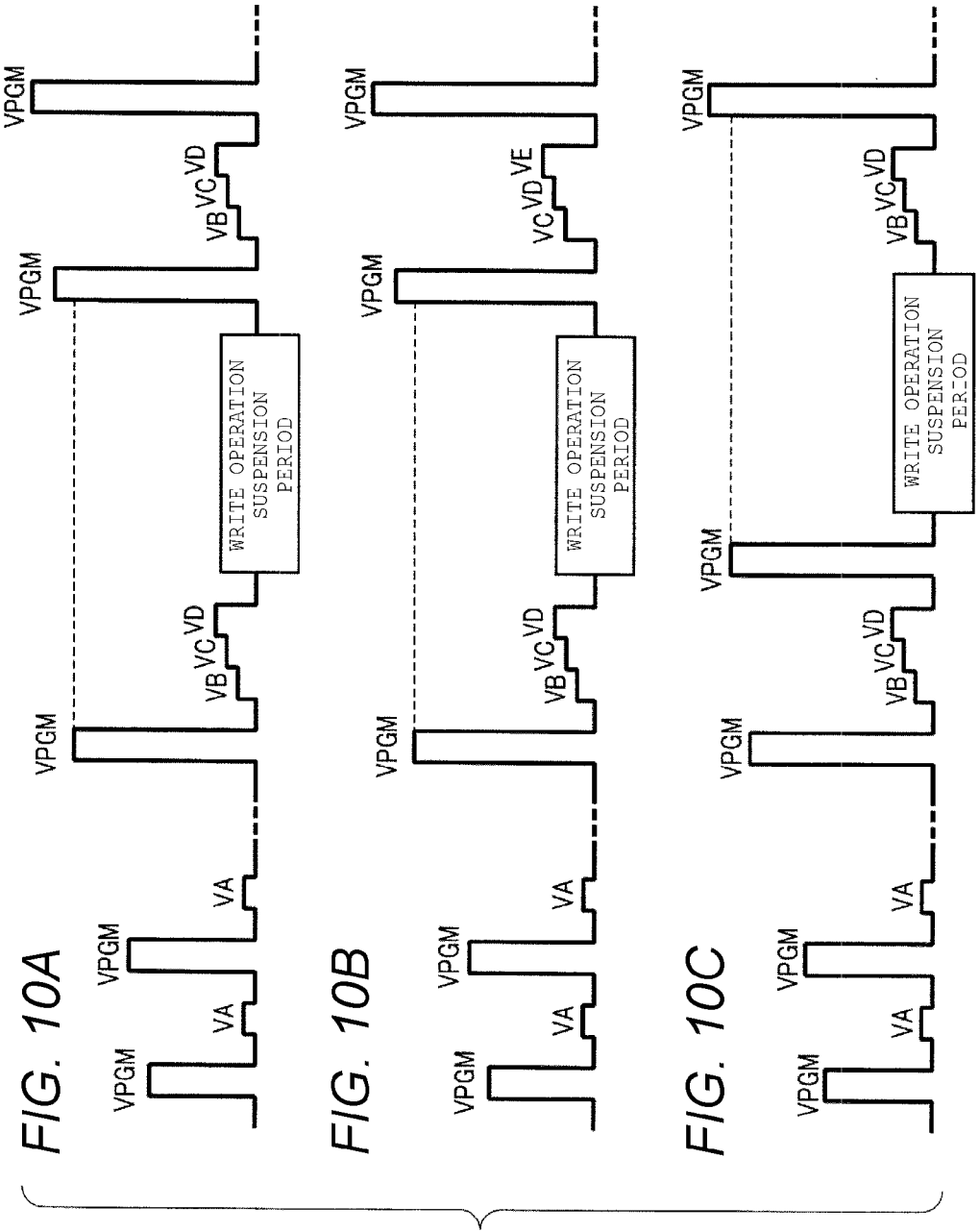
FIGS. 10A to 10C are timing charts of voltages applied to a selected word line before and after a write operation suspension period in the semiconductor memory device according to the first embodiment.

FIGS. 10A to 10C are timing charts for explaining a write operation interrupted by a read operation for the semiconductor memory device according to the first embodiment. FIGS. 10A to 10C illustrate magnitudes of voltages applied to a selected word line WL in a write operation before and after the write operation suspension period.

As illustrated in FIGS. 10A to 10C, a writing voltage VPGM is applied to the selected word line WL during a program operation, and verification voltages VA to VG are applied thereto during a verification operation. The program operation is used to increase a threshold voltage of the memory cell transistor MT, and the verification operation is used to determine whether or not the threshold voltage increased in the program operation reaches a target level among the "Er" level to the "G" level. A set of the program operation and the verification operation is repeatedly performed for a plurality of number of times. The repetition unit of the program operation and the verification operation is also referred to as a loop. If, among all of the memory cell transistors MT programmed to a certain level (for example, the "A" level), the number of bits of the memory cell transistors MT having a threshold voltage which is less than the "A" level, or the number of bytes including such memory cell transistors MT is less than a certain reference value, verification of the level ("A" level) is determined to be passed.

The writing voltage VPGM is used to inject electric charge into the charge storage layer 45 of the memory cell transistor MT, and is higher than the verification voltages VA to VG. A value of the writing voltage VPGM increases stepwise whenever the number of loops increases. A value of the writing voltage VPGM increases stepwise continuously even if the write operation suspension period is present. Consequently, a threshold voltage of the memory cell transistor MT gradually increases regardless of the presence or absence of the write operation suspension period, and finally reaches a threshold voltage having a target level.

Regarding the verification voltages VA to VG, if verification of a low level is passed, a verification voltage having a higher level is applied. In the example illustrated in FIGS. 10A to 10C, only the verification voltage VA is applied during a verification operation in first and second loops. Verification of the "A" level is passed up to loops including a loop immediately before the write operation suspension period. During a verification operation in the loop immediately before the write operation suspension period, verification of the "A" level is passed, and thus the verification voltages VB to VD are applied.

As illustrated in FIG. 10A, if verification of "B" level is not passed yet during the verification operation in the loop immediately before the write operation suspension period, the verification voltages VB to VD are also applied during a verification operation in a loop immediately after the write operation suspension period.

As illustrated in FIG. 10B, if verification of "B" level is passed during the verification operation in the loop immediately before the write operation suspension period, the verification voltages VC to VE may be applied as higher verification voltages during a verification operation in a loop immediately after the write operation suspension period. In other words, the verification operation is performed on the basis of a verification result in the last loop regardless of the presence or absence of the write operation suspension period.

As illustrated in FIG. 10C, the write operation suspension period may be inserted between a program operation and a verification operation. In the example illustrated in FIG. 10C, a verification operation immediately after the write operation suspension period is performed on a program operation immediately before the write operation suspension period.

1.2.2 Data Saving Operation

Figure 11:
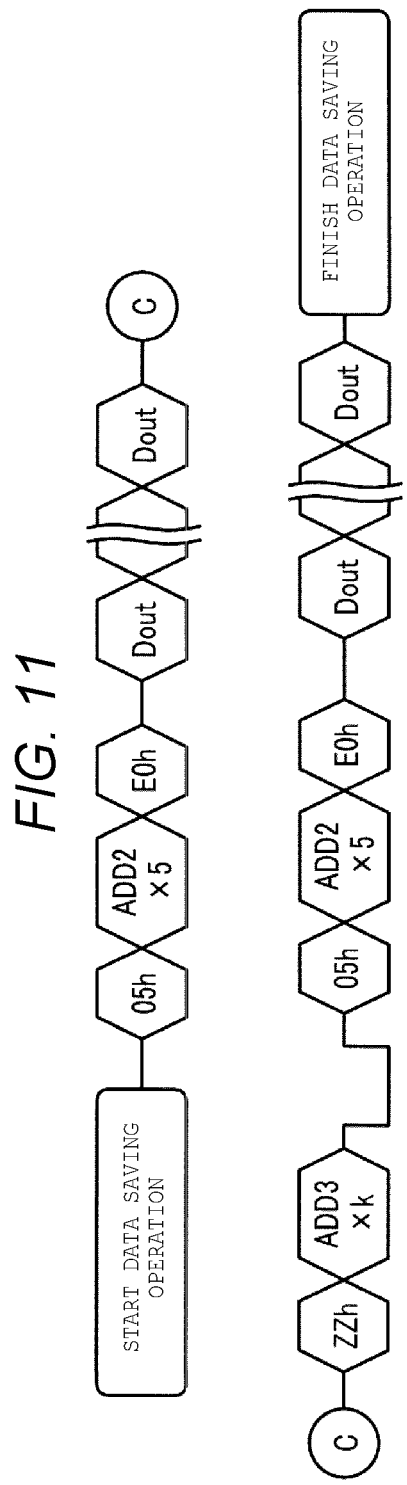
FIG. 11 is a command sequence for a data saving operation for the semiconductor memory device according to the first embodiment.

Next, a description will be made of a data saving operation for the semiconductor memory device according to the first embodiment. FIG. 11 is a command sequence for explaining a data saving operation for the semiconductor memory device according to the first embodiment.

As illustrated in FIG. 11, the controller 10 issues a command "05h", and transmits the command to the semiconductor memory device 20. The command "05h" is used to output data held in the latch circuit XDL to the controller 10. The controller 10 issues an address ADD2, for example, over five cycles, and transmits the address ADD2 to the semiconductor memory device 20. The address ADD2 is used to designate a column, and, here, designate, for example, all columns in order to output all data stored in the latch circuits XDL. The controller 10 issues a command "E0h" and transmits the command to the semiconductor memory device 20. The command "E0h" is used to output the data stored in the latch circuits XDL on the basis of the address ADD2 transmitted immediately before. If the command "E0h" is stored in the register 24, the sequencer 25 controls the input/output circuit 22 or the like, so as to output the data Dout stored in the latch circuits XDL of the sense amplifier module 28 to the controller 10. The controller 10 saves and holds the output data Dout to and in, for example, the buffer memory 14.

The controller 10 issues a command "ZZh" and transmits the command to the semiconductor memory device 20. The command "ZZh" is used to give an instruction for data transmission between the latch circuits SDL, ADL, BDL, CDL, DDL and XDL. The controller 10 issues an address ADD3, for example, over k (where k is a positive integer) cycles, and transmits the address ADD3 to the semiconductor memory device 20. The address ADD3 includes information indicating latch circuits as a transmission source and a transmission destination of data to be transmitted.

If the command "ZZh" is stored in the register 24, the sequencer 25 performs data transmission between the latch circuits. At this time, the logic control circuit 23 sets the signal /RB to an "L" level so as to notify the controller 10 that the semiconductor memory device 20 is in a busy state. A period in which the semiconductor memory device 20 is in a busy state indicates a period in which data transmission is performed between the latch circuits. If the data transmission is completed, the logic control circuit 23 sets the signal /RB to an "H" level so as to notify the controller 10 that the semiconductor memory device 20 is in a ready state.

For example, in the same manner as in the operation after the data saving operation, the controller 10 sequentially issues the command "05h", the address ADD2, and the command "E0h", and transmits the commands to the semiconductor memory device 20. The sequencer 25 controls the input/output circuit 22 or the like again, so as to output the data Dout stored in the latch circuits XDL of the sense amplifier module 28 to the controller 10.

If data is subsequently saved to the controller 10, the command "ZZh" is further issued, and thus data is transmitted to the latch circuits XDL. An operation of outputting the data stored in the latch circuits XDL to the controller 10 may be repeatedly performed.

As mentioned above, the data saving operation is finished.

FIG. 12 is a table illustrating an example of information for setting data transmission between latch circuits of the semiconductor memory device according to the first embodiment. The setting information is included in the address ADD3 which is issued after, for example, the command "ZZh".

As illustrated in FIG. 12, the information for setting up data transmission between latch circuits includes identification information of latch circuits which are a transmission source and a transmission destination. Specifically, for example, regarding the identification information of latch circuits which are a transmission source and a transmission destination, the latch circuits SDL, ADL, BDL, CDL, DDL and XDL are respectively correlated with "000", "001", "010", "011", "100", and "101" so as to be uniquely identified. The identification information of latch circuits which are a transmission source and a transmission destination, set in each latch circuit, is not limited thereto, and may be set any value as long as the respective latch circuits can be uniquely identified.

FIG. 13 is a table illustrating an example of changes in data in the latch circuits before and after a data saving operation for the semiconductor memory device according to the first embodiment. FIG. 13 illustrates a change in data in the row direction in the latch circuits in a time series from before a data saving operation is started to after data is read.

As described above, in the data saving operation, two or more of the six latch circuits XDL, ADL, BDL, CDL, DDL and SDL, transition to an overwritable state. In the first embodiment, in the following description, the data saving operation will be described assuming that three latch circuits such as the latch circuits XDL, ADL and SDL transition to an overwritable state.

As illustrated in FIG. 13, before the data saving operation is started (immediately after a write operation is suspended), data used for the write operation is stored in the latch circuits XDL, ADL, BDL, CDL, DDL and SDL, for example, as follows.

The latch circuit XDL stores cache data (abbreviated to "C" in FIG. 13).

In 3-bit data to be written into corresponding memory cell transistors MT, lower data, middle data, and upper data (abbreviated to "L", "M", and "U" in FIG. 13) are respectively stored in the latch circuits ADL, BDL and CDL. The lower data, the middle data, and the upper data are not limited to "write data transmitted from the controller 10", and may include verification results. In other words, the data stored in the latch circuits ADL, BDL and CDL allows levels of threshold voltages written into corresponding memory cell transistors MT to be determined, and also allows levels at which the memory cell transistors MT pass a verification operation to be determined. Therefore, the lower data, the middle data, and the upper data are updated on the basis of a verification result in each loop of a write operation. Specifically, for example, if data is written into the memory cell transistor MT, the data stored in the latch circuits ADL, BDL and CDL of the corresponding sense amplifier unit SAU may be updated to data "111" as information indicating that a write operation is not necessary any longer.

Data Q (abbreviated to "Q" in FIG. 13) which is used in a data writing method (hereinafter referred to as the "first writing method") is stored in the latch circuit DDL. In the first writing method, a verification operation is performed with a voltage lower than a target threshold voltage. A program operation in which an a threshold voltage is increased smaller than during a normal time is performed on the memory cell transistor MT which passes the verification operation. Consequently, a threshold voltage increase amount of the memory cell transistor MT of which a threshold voltage increases to the vicinity of the target threshold voltage can be finely controlled, and thus a distribution range of the threshold voltage can be narrowed.

For example, writing instruction data (abbreviated to "W" in FIG. 13) for determining whether or not the bit line BL is selected during a write operation is stored in the latch circuit SDL. The writing instruction data is calculated through a calculation process based on lower data, middle data, and upper data in each loop. The writing instruction data can be calculated on the basis of lower data, middle data, and upper data as described above, and is thus overwritable data during a read operation. In FIG. 13, overwritable data is added with "(WE)" so as to be differentiated from data which is not overwritable.

As illustrated in FIG. 13, in the data saving operation based on the command sequence illustrated in FIG. 11, first, the cache data stored in the latch circuit XDL is transmitted to the controller 10. The cache data is temporarily held in, for example, the buffer memory 14. Consequently, the latch circuit XDL transitions to an overwritable state.

Next, the lower data stored in the latch circuit ADL is transmitted to the latch circuit XDL. Specifically, "000" is designated as identification information of a latch circuit which is a transmission source, and "101" is designated as identification information of a latch circuit as a transmission destination, in the address ADD3. Consequently, the latch circuit ADL transitions to an overwritable state instead of the latch circuit XDL.

Next, the lower data stored in the latch circuit XDL is transmitted to the controller 10. The lower data is temporarily stored in, for example, the buffer memory 14 in the same manner as the cache data. Consequently, the latch circuit XDL transitions to an overwritable state. Through the above-described data saving operation, the three latch circuits XDL, ADL and SDL transition to an overwritable state.

In a read operation after the data saving operation, data required for reading is stored in the latch circuits XDL, ADL and SDL. Specifically, read option data (abbreviated to "ROP" in FIG. 13) is stored in the latch circuits XDL and ADL. Read data (abbreviated to "R" in FIG. 13) to be output to the controller 10 is stored in the latch circuit SDL. The read data is calculated, for example, through a calculation process based on the read option data stored in the latch circuits XDL and ADL. The read data which is read out to the latch circuit SDL is output to the controller 10 via the latch circuit XDL.

1.2.3 Data Restoring Operation

Figure 14:
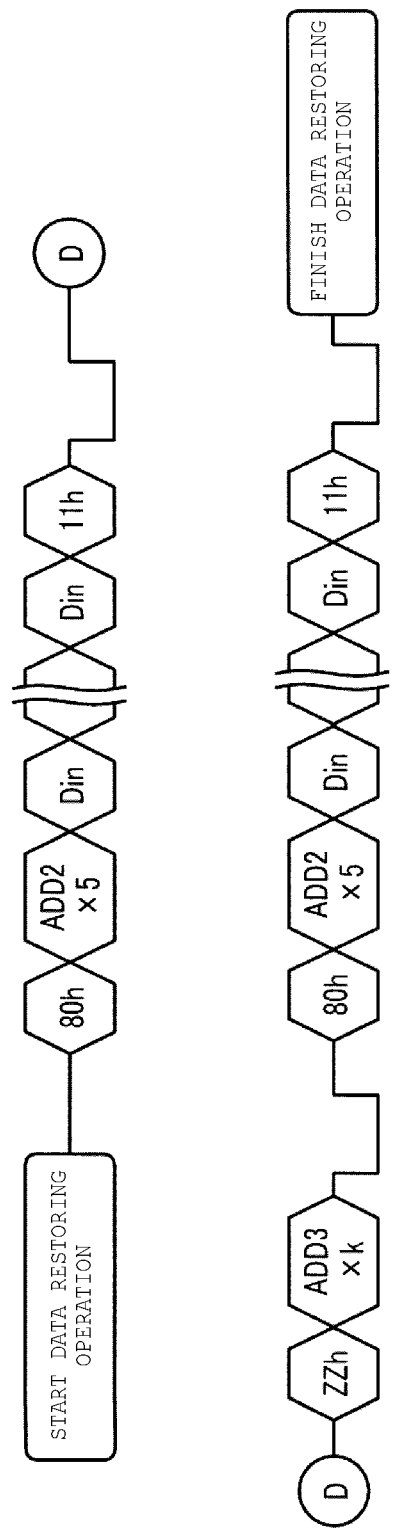
FIG. 14 is a command sequence for a data restoring operation for the semiconductor memory device according to the first embodiment.

Next, a description will be made of a data restoring operation for the semiconductor memory device according to the first embodiment. FIG. 14 is a command sequence for explaining a data restoring operation for the semiconductor memory device according to the first embodiment.

As illustrated in FIG. 14, the controller 10 issues a command "80h", and transmits the command to the semiconductor memory device 20. The controller 10 issues an address ADD2, for example, over five cycles, and transmits the address ADD2 to the semiconductor memory device 20. Next, the controller 10 transmits write data Din to the semiconductor memory device 20. The write data Din is, for example, lower data stored in the buffer memory 14 in a data saving operation. In other words, the lower data includes information regarding a verification result immediately before a write operation is suspended.

The controller 10 issues a command "11h" and transmits the command to the semiconductor memory device 20. The command "11h" is used to cause the data to be written into the latch circuit XDL on the basis of the address ADD2 transmitted immediately before. If the command "11h" is stored in the register 24, the sequencer 25 completes writing of the data.

At this time, the logic control circuit 23 sets the signal /RB to an "L" level so as to notify the controller 10 that the semiconductor memory device 20 is in a busy state. After writing of the lower data into the latch circuit XDL is completed, the logic control circuit 23 sets the signal /RB to an "H" level so as to notify the controller 10 that the semiconductor memory device 20 is in a ready state.

The controller 10 issues a command "ZZh" and transmits the command to the semiconductor memory device 20. The controller 10 issues an address ADD3, for example, over k cycles, and transmits the address ADD3 to the semiconductor memory device 20. If the command "ZZh" is stored in the register 24, the sequencer 25 performs data transmission between the latch circuits. Specifically, for example, "101" is designated as identification information of a latch circuit as a transmission source of the address ADD3, and "000" is designated as identification information of a latch circuit which is a transmission destination. Consequently, the sequencer 25 transmits the lower data stored in the latch circuit XDL to the latch circuit ADL.

At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

For example, in the same manner as in the operation after the data restoring operation is started, the controller 10 sequentially issues the command "80h", the address ADD2, the write data Din, and the command "11h", and transmits the commands and the data to the semiconductor memory device 20. The write data Din here is, for example, cache data stored in the buffer memory 14 in the data saving operation. The sequencer 25 writes the cache data into the latch circuit XDL.

If data restoring is further performed, the command "ZZh" is also issued, and thus data is transmitted from the latch circuit XDL to any one of the other latch circuits ADL, BDL, CDL, DDL and SDL. Data may be repeatedly written into the latch circuit XDL from the controller 10.

As mentioned above, the data restoring operation is finished.

FIG. 15 is a table illustrating an example of changes in data in the latch circuits before and after a data restoring operation for the semiconductor memory device according to the first embodiment. FIG. 15 illustrates changes in data in the latch circuits in the row direction from a time before a data restoring operation is started to a time after data is restored. In FIG. 15, each data item is indicated by the same abbreviation as in FIG. 13.

As illustrated in FIG. 15, data reading is finished before the data restoring operation is performed. Thus, the read data stored in the latch circuit SDL, and the read option data stored in the latch circuits XDL and ADL are overwritable data.

In the data restoring operation, first, the lower data stored in the buffer memory 14 is transmitted to the latch circuit XDL. Consequently, the lower data is overwritten on the data held in the latch circuit XDL.

Next, the lower data written into the latch circuit XDL is transmitted to the latch circuit ADL. Consequently, the lower data is stored in the latch circuit ADL, and is thus restored into a state before the data saving operation. Next, the cache data stored in the buffer memory 14 is transmitted to the latch circuit XDL. Consequently, the data in the latch circuit XDL is restored into a state before the data saving operation.

Thereafter, writing instruction data is generated through a calculation process based on the lower data, the middle data, and the upper data prior to resuming of a write operation, and is stored in the latch circuit SDL. The data items in the latch circuits XDL, ADL, BDL, CDL, DDL and SDL are all restored through the above-described data restoring operation.

1.3 Effects Related to the Present Embodiment

According to the first embodiment, a read operation can be performed by using a latch circuit in which data required to resume an interrupted write operation is held, and then the write operation can be resumed. This effect will be described below.

When data held in a memory cell transistor is read, the read data is temporarily held in a latch circuit until the data is transmitted to an external controller. On the other hand, if a write operation is suspended, data required to resume the write operation is already held in the latch circuit. Thus, if a read operation is performed during suspension of the write operation, there is a probability that the number of latch circuits temporarily holding read data until being transmitted to the external controller may be insufficient.

In the related art, there is a technique in which, for example, read data is overwritten into a latch circuit holding data which is not necessarily required to resume a write operation among a plurality of latch circuits of a sense amplifier unit.

However, in the related art, there is a probability that the number of latch circuits may be insufficient if not only read data but also read option data for generating the read data is required to be held. In other words, if special read operations are performed, a plurality of read option data items as well as the read data are required to be held by using a plurality of latch circuits. In this case, a read operation cannot be performed without data required to resume a write operation being lost. In other words, in the related art, if the read operation is performed by using a latch circuit holding data required to resume a write operation, and then the write operation cannot be resumed.

In the semiconductor memory device according to the first embodiment, the sequencer 25 causes data held in the latch circuits ADL and XDL of the of the sense amplifier module 28 to be held in the buffer memory 14 of the controller 10 after a write operation is suspended and before a reading command is received. Consequently, in a stage in which the reading command is executed, some data required to resume the write operation is saved to the outside of the sense amplifier unit SAU. Thus, the latch circuits ADL and XDL from which data is saved can hold read option data.

During a read operation, the sequencer 25 causes read option data which is read from the memory cell transistor MT to be held in the latch circuits ADL and XDL from which data is saved. The data in the latch circuits ADL and XDL is overwritten with the read option data, but the overwritten data is already saved to the buffer memory 14 of the controller 10 and can thus be restored through a subsequent restoring operation. Therefore, a latch circuit holding data required to resume a write operation can be used in a read operation during suspension of the write operation.

The sequencer 25 transmits the data transmitted to the controller 10, to the original latch circuits ADL and XDL, after the read operation is finished and before the command "YYh" for resuming the write operation is received. Consequently, data required to resume a write operation can be restored to a latch circuit holding the data, before a write operation is resumed. Therefore, a read operation can be performed by using a latch circuit in which data required to resume a write operation is held, and then the write operation can be resumed.

The sense amplifier module 28 includes the latch circuit XDL. The latch circuit XDL is a latch circuit through which data necessarily passes during data transmission between the other latch circuits ADL, BDL, CDL, DDL and SDL and the controller 10. In other words, data is required to be transmitted to the latch circuit XDL in order to save the data held in the latch circuits ADL, BDL, CDL, DDL and SDL to the controller 10. If the command "ZZh" is received, the sequencer 25 performs a data transmission operation between the latch circuits. Consequently, data transmission between the latch circuits can be easily performed.

The sequencer 25 receives the command "ZZh" and then receives the address ADD3. The sequencer 25 specifies a transmission source and a transmission destination in a transmission operation between latch circuits on the basis of the address ADD3. Consequently, data transmission between any latch circuits among the latch circuits ADL, BDL, CDL, DDL, SDL and XDL of the sense amplifier module 28 can be easily performed.

1.4 Modification Examples of First Embodiment

The semiconductor memory device according to the first embodiment is not limited to the above-described example, and may be modified.

For example, in the semiconductor memory device according to the first embodiment, during data transmission between latch circuits in a data saving operation and a data restoring operation, the command "ZZh" and the address ADD3 are issued, but any other method may be employed. Specifically, there may be a configuration in which only the command is issued without issuing the address ADD3, and thus data transmission in which latch circuits as a transmission source and a transmission destination are pre-designated is performed.

FIG. 16 is a command sequence for a data saving operation for the semiconductor memory device according to a modification example of the first embodiment. As illustrated in FIG. 16, the controller 10 issues a command "05h", and transmits the command to the semiconductor memory device 20. The controller 10 issues an address ADD2, for example, over five cycles, and transmits the address ADD2 to the semiconductor memory device 20. The controller 10 issues a command "E0h" and transmits the command to the semiconductor memory device 20.

The controller 10 issues a command "Z1sh" and transmits the command to the semiconductor memory device 20. The command "Z1sh" is used to instruct data to be transmitted from, for example, the latch circuit ADL to the latch circuit XDL.

If the command "Z1sh" is stored in the register 24, the sequencer 25 transmits data from the latch circuit ADL to the latch circuit XDL. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

For example, in the same manner as in the operation after the data saving operation is started, the controller 10 sequentially issues the command "05h", the address ADD2, and the command "E0h", and transmits the commands to the semiconductor memory device 20. The sequencer 25 controls the input/output circuit 22 or the like, so as to output the data Dout stored in the latch circuits XDL of the sense amplifier module 28 to the controller 10.

If data is further saved to the controller 10, for example, specific commands (for example, "Z2sh", "Z3sh", "Z4sh", and "Z5sh" (none illustrated)) for transmitting data from other latch circuits BDL, CDL, DDL and SDL to the latch circuit XDL are issued, and thus data transmission to the latch circuits XDL is performed. An operation of outputting the data stored in the latch circuits XDL to the controller 10 may be repeatedly performed.

As mentioned above, the data saving operation is finished.

FIG. 17 is a command sequence for a data restoring operation for the semiconductor memory device according to a modification example of the first embodiment. As illustrated in FIG. 17, the controller 10 issues a command "80h", and transmits the command to the semiconductor memory device 20. The controller 10 issues an address ADD2, for example, over five cycles, and transmits the address ADD2 to the semiconductor memory device 20. Next, the controller 10 transmits lower data stored in the buffer memory 14 to the semiconductor memory device 20 as write data Din.

The controller 10 issues a command "11h" and transmits the command to the semiconductor memory device 20. The logic control circuit 23 sets the signal /RB to an "L" level so as to notify the controller 10 that the semiconductor memory device 20 is in a busy state. After writing of the lower data into the latch circuit XDL is completed, the logic control circuit 23 sets the signal /RB to an "H" level so as to notify the controller 10 that the semiconductor memory device 20 is in a ready state.

The controller 10 issues a command "Z1rh" and transmits the command to the semiconductor memory device 20. The command "Z1rh" is used to instruct data to be transmitted from, for example, the latch circuit XDL to the latch circuit ADL. If the command "Z1rh" is stored in the register 24, the sequencer 25 transmits the data from the latch circuit XDL to the latch circuit ADL. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

For example, in the same manner as in the operation after the data restoring operation is started, the controller 10 sequentially issues the command "80h", the address ADD2, the write data Din which is cache data stored in the buffer memory 14, and the command "11h", and transmits the commands and the data to the semiconductor memory device 20. The sequencer 25 writes the cache data into the latch circuit XDL.

If data restoring is further performed, for example, specific commands (for example, "Z2rh", "Z3rh", "Z4rh", and "Z5rh" (none illustrated)) for transmitting data from the latch circuit XDL to other latch circuits BDL, CDL, DDL and SDL are issued, and thus data is transmitted from the latch circuit XDL to any one of the other latch circuits BDL, CDL, DDL and SDL. Data may be repeatedly written into the latch circuit XDL from the controller 10.

As mentioned above, the data restoring operation is finished.

According to the modification example of the first embodiment, a data saving operation and a data restoring operation can be performed according to a simpler command sequence. This effect will be described below.

If data transmission between any latch circuits is expected, as described in the first embodiment, latch circuits as a transmission source and a transmission destination are effectively specified by issuing the command "ZZh" and then issuing the address ADD3. If latch circuits between which data transmission is performed are specified, the same information is normally included in the address ADD3. The information which does not change every time is preferably omitted.

According to the semiconductor memory device of the modification example of the first embodiment, a data transmission operation between latch circuits is performed by receiving the commands "Z1sh" and "Z1rh" without receiving the address ADD3. Consequently, issuing of the address ADD3 can be omitted. Thus, a data saving operation and a data restoring operation can be performed more simply at a high speed, and a user's convenience can be expected to be improved.

2. Second Embodiment

Next, a description will be made of a semiconductor memory device of a second embodiment. Whereas the semiconductor memory device according to the first embodiment saves data to the controller 10 outside the sense amplifier module 28, the semiconductor memory device according to the second embodiment saves data to an overwritable region inside the sense amplifier module 28. In the second embodiment, an interrupting read operation during a write operation is performed on a ½ page. In the following description, the same constituent elements as the constituent elements in the first embodiment are given the same reference numerals, description thereof will be omitted, and only differences from the first embodiment will be described.

2.1 Summary of Write Operation Interrupted by a Read Operation

Figure 18:
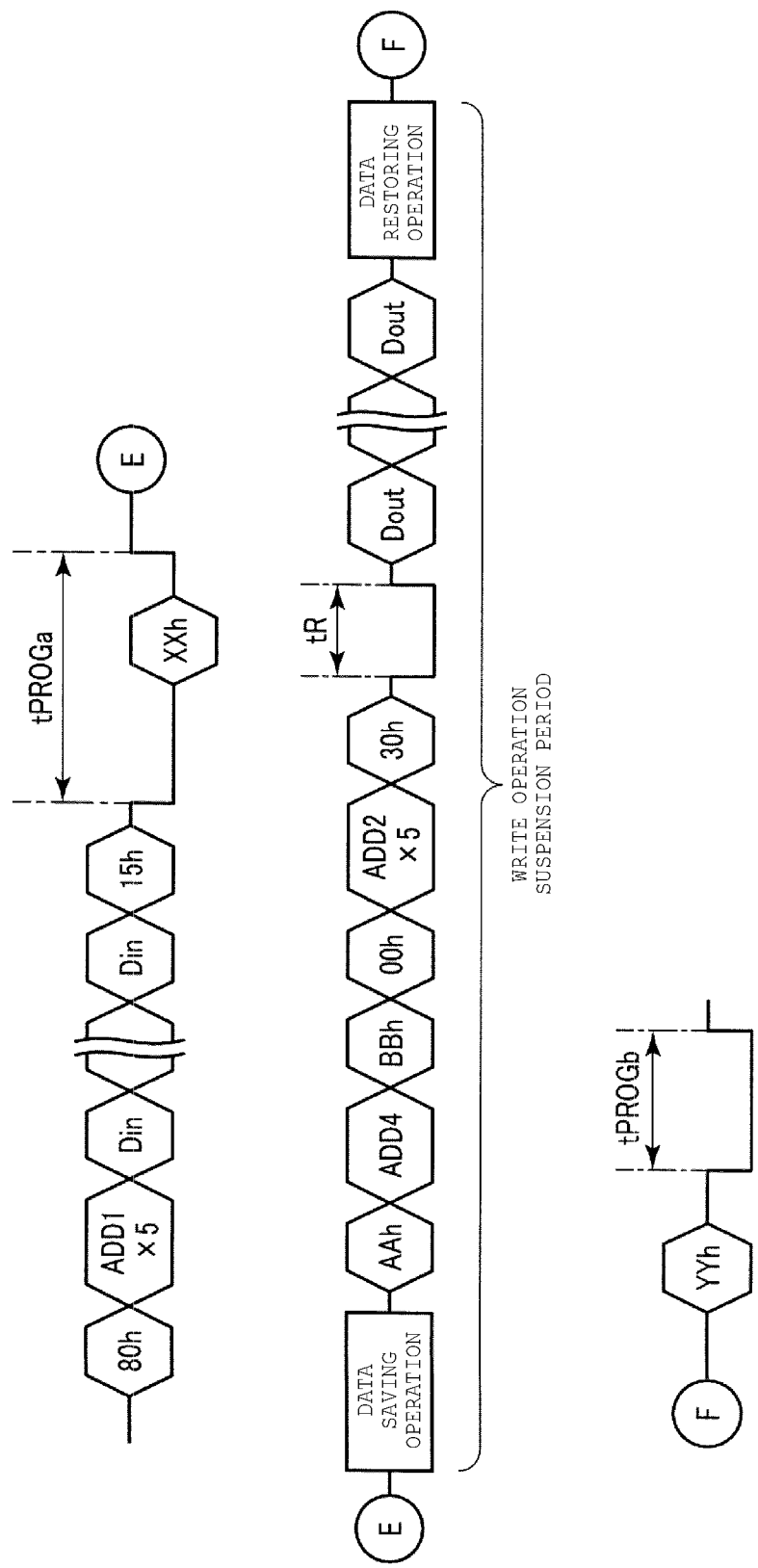
FIG. 18 is a command sequence for a write operation interrupted by a read operation for a semiconductor memory device according to a second embodiment.

A description will be made of a write operation that is interrupted by a read operation in the semiconductor memory device according to the second embodiment. FIG. 18 is a command sequence for a write operation that is interrupted by a read operation in the semiconductor memory device according to the second embodiment.

As illustrated in FIG. 18, a sequence until a write operation is suspended is the same as in the first embodiment, and thus a description thereof will be omitted. The write operation is suspended, and then a data saving operation is performed. Details of the data saving operation will be described later.

After the data saving operation is completed, the controller 10 issues a command "AAh" and transmits the command to the semiconductor memory device 20. The command "AAh" is used to given an instruction for PPR in cooperation with the subsequent reading command "00h", that is, to give an instruction for a partial read operation in one page. In the second embodiment, the command "AAh" is used to instruct data of a ½ page (8 KB) to be read. The controller 10 issues an address ADD4, for example, over one cycle, and transmits the address ADD4 to the semiconductor memory device 20. The address ADD4 is used to designate, for example, which one of two ½ pages in one page is read. A read region may be variably defined. For example, a data region corresponding to the memory cell transistor MT connected to the sense amplifier unit SAU<e> or a data region corresponding to the memory cell transistor MT connected to the sense amplifier unit SAU<o> may be designated as the ½ page.

Next, the controller 10 consecutively issues commands "BBh" and "00h", and then issues an address ADD2 and a command "30h". The same read operation as in the first embodiment is performed as mentioned above, and then the sequencer 25 performs a data restoring operation. Details of the data restoring operation will be described later.

The subsequent sequence for performing a writing resuming operation is the same as in the first embodiment, and a description thereof will be omitted. In the above-described way, the write operation interrupted by the read operation is finished.

FIG. 19 is a table illustrating an example of setting a read region in a read operation for the semiconductor memory device according to the second embodiment. Information for setting a read region illustrated in FIG. 19 is included in, for example, the address ADD4. As illustrated in FIG. 19, the information for setting a read region includes information (in-page region identification information) for identifying which region in one page is a reading target. Specifically, for example, the in-page region identification information is set to "0" if data which is a portion of one page correlated with the sense amplifier unit SAU<e> is read, and is set to "1" if data which is a portion of one page correlated with the sense amplifier unit SAU<o> is read.

2.2 Data Saving Operation and Data Restoring Operation

Next, a description will be made of a data saving operation and a data restoring operation for the semiconductor memory device according to the second embodiment. In the following description of the second embodiment, the description will be made of a data saving operation in which two latch circuits including the latch circuits ADL and SDL transition to an overwritable state, and a data restoring operation for restoring data into a state before the data saving operation. In a read operation of a ½ page, the description will be made assuming that data is read from the memory cell transistor MT corresponding to the sense amplifier unit SAU<e>.

FIG. 20 is a command sequence for a data saving operation or a data restoring operation for the semiconductor memory device according to the second embodiment. The data saving operation and the data restoring operation in the second embodiment are represented by, for example, the same command sequence.

As illustrated in FIG. 20, the controller 10 issues a command "ZZh" and transmits the command to the semiconductor memory device 20. The controller 10 issues an address ADD3, for example, over k cycles, and transmits the address ADD3 to the semiconductor memory device 20. The address ADD3 is different from the address ADD3 of the first embodiment in that the address ADD3 of this embodiment includes information for designating latch circuits corresponding to a ½ page and transmitting data.

If the command "ZZh" is stored in the register 24, the sequencer 25 performs data transmission between the latch circuits. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

As mentioned above, the data saving operation or the data restoring operation is finished.

FIG. 21 is a table showing identification information used in transmitting data between latch circuits of the semiconductor memory device according to the second embodiment. The information for setting data transmission between latch circuits, illustrated in FIG. 21, is included in, for example, the address ADD3.

As illustrated in FIG. 21, the information indicating latch circuits as a transmission source and a transmission destination includes not only latch circuit identification information but also information (in-page region identification information) for identifying in which region in one page a latch circuit as a transmission target is included.

Here, a value of the in-page region identification information of a transmission source, designated in the address ADD3 illustrated in FIG. 21, matches a value of the in-page region identification information designated in the address ADD4 illustrated in FIG. 19. In the above-described way, a reading target is the memory cell transistor MT connected to a portion which does not receive save data from the latch circuit SDL, and read data is held in the portion which does not receive the save data from the latch circuit SDL. As mentioned above, the controller 10 imposes the restriction that a value of in-page region identification information matching a value of in-page region identification information of a transmission source is also designated in the address ADD4.

FIG. 22 is a table illustrating an example of changes in data in the latch circuits before and after a data saving operation and a data restoring operation for the semiconductor memory device according to the second embodiment. FIG. 22 illustrates changes in data in the latch circuits in the row direction from a time data is saved to a time after the data is restored. In FIG. 22, each data item is indicated by the same abbreviation as in FIGS. 13 and 15 according to the first embodiment.

As illustrated in FIG. 22, before the data saving operation is started (immediately after a write operation is suspended), cache data, lower data, middle data, upper data, data Q, and overwritable writing instruction data are respectively stored in the latch circuits XDL, ADL, BDL, CDL, DDL and SDL.

In the data saving operation, the lower data stored in the latch circuit ADL<e> is transmitted to the latch circuit SDL<o>. Specifically, for example, in the address ADD3, "000" is designated as identification information of a latch circuit which is a transmission source, and "0" is designated as in-page region identification information. "100" is designated as identification information of a latch circuit which is a transmission destination, and "1" is designated as in-page region identification information. Consequently, the latch circuit ADL<e> transitions to an overwritable state. Through the above-described data saving operation, the two latch circuit ADL<e> and SDL<e> in a region of the ½ page transition to an overwritable state.

In a read operation after the data saving operation, data required in reading is stored in the latch circuits ADL<e> and SDL<e>. Specifically, read option data is stored in the latch circuit ADL<e>, and read data which is to be read out to the controller 10 is stored in the latch circuit SDL<e>.

In a data restoring operation, lower data stored in the latch circuit SDL<o> is transmitted to the latch circuit ADL<e>. Specifically, for example, in the address ADD3, "100" is designated as identification information of a latch circuit which is a transmission source, and "1" is designated as in-page region identification information. "000" is designated as identification information of a latch circuit which is a transmission destination, and "0" is designated as in-page region identification information. Consequently, the lower data in the latch circuit ADL is restored into a state before the data saving operation.

Thereafter, writing instruction data is generated through a calculation process based on the lower data, the middle data, and the upper data prior to resuming of a write operation, and is stored in the latch circuit SDL. The data items in the latch circuits XDL, ADL, BDL, CDL, DDL and SDL are all restored through the above-described data restoring operation.

2.3 Effects Related to the Present Embodiment

According to the second embodiment, the sequencer 25 causes data held in a latch circuit of the sense amplifier unit SAU<e> to be held in a latch circuit of the sense amplifier unit SAU<o> after a write operation is suspended and before a reading command is received. Consequently, in a stage in which the reading command is executed, some data required to resume the write operation is saved to the outside of the sense amplifier unit SAU<e>. Thus, the latch circuit ADL from which data is saved can hold read option data.

During a read operation, the sequencer 25 causes read option data which is read from the memory cell transistor MT to be held in the latch circuit ADL of the sense amplifier unit SAU<e> from which data is saved. The data in the latch circuit ADL is overwritten with the read option data, but the overwritten data is already saved to the sense amplifier unit SAU<o> and can thus be restored through a subsequent restoring operation. Therefore, a latch circuit holding data required to resume a write operation can be used in a read operation during suspension of the write operation.

The sequencer 25 transmits the data transmitted to the latch circuit SDL of the sense amplifier unit SAU<o>, to the original latch circuit ADL of the sense amplifier unit SAU<e>, after the read operation is finished and before the command "YYh" for resuming the write operation is received. Consequently, data required to resume a write operation can be restored to a latch circuit holding the data, before a write operation is resumed. Therefore, a read operation can be performed by using a latch circuit in which data required to resume a write operation is held, and then the write operation can be resumed.

As described above, data which is held in the latch circuit ADL of the sense amplifier unit SAU<e> and is required to resume a write operation is saved to the latch circuit SDL of the sense amplifier unit SAU<o>. Thus, if data is read out to the sense amplifier unit SAU<o> during a read operation, there is a probability that the saved data may be overwritten with the read data and may thus be lost. In the second embodiment, the controller 10 matches a value of in-page region identification information in the address ADD4 with a value of in-page region identification information of a transmission source in the address ADD3 in a read operation. In the above-described way, read data is held in a portion which does not receive save data from the latch circuit SDL. As mentioned above, reading-out of data to the sense amplifier unit SAU<o> is restricted. Thus, save data can be prevented from being lost due to reading of data. Therefore, a write operation can be resumed after a read operation.

In a read operation, data with a size of a ½ page is read. Specifically, the sense amplifier units SAU of the sense amplifier module 28 include the sense amplifier units SAU<e> and SAU<o> of the same number. Consequently, if reading-out of data to the sense amplifier unit SAU<o> is restricted while a read operation is performed on the sense amplifier unit SAU<e>, data of a half (8 KB) of a data size (16 KB) corresponding to a case where a read operation is performed on all of the sense amplifier units SAU can be read.

The sense amplifier unit SAU<e> is connected to the sense amplifier unit SAU<o> via the bus LBUS. Thus, data saving between the sense amplifier unit SAU<e> and the sense amplifier unit SAU<o> can be performed via only the bus LBUS without using the bus DBUS. Consequently, the time required for data saving can be reduced compared with data saving using the bus DBUS, and thus an operation speed can be improved.

The sequencer 25 receives the command "ZZh" and then receives the address ADD3. The sequencer 25 specifies a transmission source and a transmission destination in a transmission operation between latch circuits on the basis of the address ADD3. Consequently, data transmission between any latch circuits among the latch circuits ADL, BDL, CDL, DDL, SDL and XDL of the sense amplifier module 28 can be easily performed.

2.4 Modification Examples of Second Embodiment

The semiconductor memory device according to the second embodiment is not limited to the above-described example, and may be modified.

For example, in the semiconductor memory device according to the second embodiment, during data transmission between latch circuits in a data saving operation and a data restoring operation, the command "ZZh" and the address ADD3 are issued, but any other method may be employed. Specifically, there may be a configuration in which only the command is issued without issuing the address ADD3, and thus data transmission in which latch circuits as a transmission source and a transmission destination are pre-designated is performed, in the same manner as in the modification example of the first embodiment.

FIG. 23 is a command sequence for explaining a data saving operation for the semiconductor memory device according to a modification example of the second embodiment. As illustrated in FIG. 24, the controller 10 issues a command "Z1esh", and transmits the command to the semiconductor memory device 20. The command "Z1esh" is used to instruct data to be transmitted from, for example, the latch circuit ADL<e> to the latch circuit SDL<o>.

If the command "Z1esh" is stored in the register 24, the sequencer 25 transmits data from the latch circuit ADL<e> to the latch circuit SDL<o>. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

If data is saved from the latch circuit ADL<o> to the latch circuit SDL<e>, for example, a specific command "Z1osh" (not illustrated) may be issued, and thus the data may be transmitted from the latch circuit ADL<o> to the latch circuit SDL<e>.

If data is saved from other latch circuits BDL<e>, CDL<e> and DDL<e> to the latch circuit SDL<o>, for example, specific commands (for example, "Z2esh", "Z3esh", and "Z4esh" (none illustrated)) may be issued, and thus the data may be transmitted from the latch circuit BDL<e>, CDL<e> and DDL<e> to the latch circuit SDL<o>.

As mentioned above, the data saving operation is finished.

FIG. 24 is a command sequence for explaining a data restoring operation for the semiconductor memory device according to a modification example of the second embodiment.

As illustrated in FIG. 24, the controller 10 issues a command "Z1erh" and transmits the command to the semiconductor memory device 20. The command "Z1erh" is used to instruct data to be transmitted from, for example, the latch circuit SDL<o> to the latch circuit ADL<e>. If the command "Z1erh" is stored in the register 24, the sequencer 25 transmits the data from the latch circuit SDL<o> to the latch circuit ADL<e>. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

If data is saved from the latch circuit SDL<e> to the latch circuit ADL<o>, for example, a specific command "Z1orh" (not illustrated) may be issued, and thus the data may be transmitted from the latch circuit SDL<e> to the latch circuit ADL<o>.

If data is saved from the latch circuit SDL<o> to other latch circuits BDL<e>, CDL<e> and DDL<e>, for example, specific commands (for example, "Z2erh", "Z3erh", and "Z4erh" (none illustrated)) may be issued, and thus the data may be transmitted from the latch circuit SDL<o> to the latch circuits BDL<e>, CDL<e> and DDL<e>.

As mentioned above, the data restoring operation is finished.

According to the modification example of the second embodiment, a data saving operation and a data restoring operation can be performed according to a simpler command sequence. This effect will be described below.

If data transmission between any latch circuits is expected, as described in the second embodiment, latch circuits as a transmission source and a transmission destination are effectively specified by issuing the command "ZZh" and then issuing the address ADD3. If latch circuits between which data transmission is performed are mutually specified, the same information is normally included in the address ADD3. The information which does not change every time is preferably omitted.

According to the semiconductor memory device of the modification example of the second embodiment, a data transmission operation between latch circuits is performed by receiving the commands "Z1esh" and "Z1erh" without receiving the address ADD3. Consequently, issuing of the address ADD3 can be omitted. Thus, a data saving operation and a data restoring operation can be performed more simply at a high speed, and a user's convenience can be expected to be improved.

3. Third Embodiment

Next, a description will be made of a semiconductor memory device of a third embodiment. Whereas the semiconductor memory device according to the second embodiment saves data of 8 KB to the inside of the sense amplifier module 28, the semiconductor memory device according to the third embodiment saves data of 4 KB to the inside of the sense amplifier module 28. In the following description, the same constituent elements as the constituent elements in the second embodiment are given the same reference numerals, description thereof will be omitted, and only differences from the second embodiment will be described.

3.1 Summary of Write Operation Interrupted by Read Operation

A description will be made of a summary of a write operation interrupted by a read operation for the semiconductor memory device according to the third embodiment. In a command sequence of a write operation interrupted by a read operation according to the third embodiment, the command "AAh" is used to instruct data of a ¼ page (4 KB) to be read. The address ADD4 is different from the address ADD4 of the second embodiment in that the address ADD4 of this embodiment includes information for designating the sense amplifier units SAU corresponding to a ¼ page. Other portions of the command sequence are the same as in FIG. 18 in the second embodiment. Details of a data saving operation and a data restoring operation will be described later.

FIG. 25 is a table illustrating an example of setting a read region in a read operation for the semiconductor memory device according to the third embodiment. Information for setting a read region illustrated in FIG. 25 is included in, for example, the address ADD4. As illustrated in FIG. 25, the information for setting a read region includes in-page region identification information. Specifically, for example, the in-page region identification information is set to "00", "01", "10", and "11" if data of portions correlated with the sense amplifier units SAU<e1>, SAU<e2>, SAU<o1> and SAU<o2> in one page is read.

3.2 Data Saving Operation and Data Restoring Operation

Next, a description will be made of a data saving operation and a data restoring operation for the semiconductor memory device according to the third embodiment. In the following description of the third embodiment, the description will be made of a data saving operation and a data restoring operation in which four latch circuits including the latch circuits XDL, ADL, BDL and SDL transition to an overwritable state. In a read operation of a ¼ page, the description will be made assuming that data is read from the memory cell transistor MT corresponding to the sense amplifier unit SAU<e1>.

Figure 26:
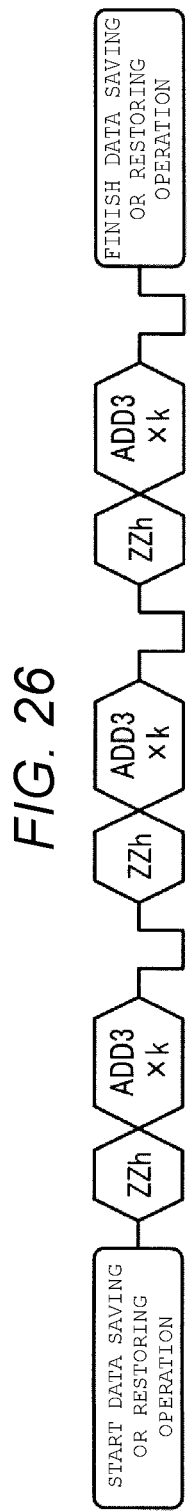
FIG. 26 is a command sequence for explaining a data saving operation or a data restoring operation for the semiconductor memory device of the third embodiment.

FIG. 26 is a command sequence for a data saving operation or a data restoring operation for the semiconductor memory device according to the third embodiment. The data saving operation and the data restoring operation in the third embodiment are represented by the same command sequence.

As illustrated in FIG. 26, the controller 10 issues a command "ZZh" and transmits the command to the semiconductor memory device 20. The controller 10 issues an address ADD3, for example, over k cycles, and transmits the address ADD3 to the semiconductor memory device 20. The address ADD3 is different from the address ADD3 of the second embodiment in that the address ADD3 of this embodiment includes information for designating latch circuits corresponding to a ¼ page and transmitting data.

If the command "ZZh" is stored in the register 24, the sequencer 25 performs data transmission between the latch circuits. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

The above-described operation is repeatedly performed by the number of times which is defined according to a desired form of a data saving operation or a data restoring operation. FIG. 26 illustrates an example in which a set of the command "ZZh" and the address ADD3 is transmitted a total of three times, and the data saving operation or the data restoring operation is finished.

FIG. 27 is a table showing identification information used in transmitting data between latch circuits of the semiconductor memory device according to the third embodiment. The information for setting data transmission between latch circuits, illustrated in FIG. 27, is included in, for example, the address ADD3.

As illustrated in FIG. 27, the information indicating latch circuits as a transmission source and a transmission destination includes not only latch circuit identification information but also in-page region identification information.

Here, a value of the in-page region identification information of a transmission source, designated in the address ADD3 illustrated in FIG. 27, matches a value of the in-page region identification information designated in the address ADD4 illustrated in FIG. 25. In the above-described way, a reading target is the memory cell transistor MT connected to a portion which does not receive save data from the latch circuit SDL, and read data is held in the portion which does not receive the save data from the latch circuit SDL. As mentioned above, the controller 10 imposes the restriction that a value of in-page region identification information matching a value of in-page region identification information of a transmission source is also designated in the address ADD4.

FIG. 28 is a table illustrating an example of a change in data in the latch circuits before and after a data saving operation and a data restoring operation for the semiconductor memory device according to the third embodiment. FIG. 28 illustrates changes in data in the latch circuits in the row direction from a time before a data is saved to a time after the data is restored. In FIG. 28, each data item is indicated by the same abbreviation as in FIG. 22 according to the second embodiment.

As illustrated in FIG. 28, before the data saving operation is started (immediately after a write operation is suspended), cache data, lower data, middle data, upper data, data Q, and overwritable writing instruction data are respectively stored in the latch circuits XDL, ADL, BDL, CDL, DDL and SDL.

In the data saving operation, the cache data stored in the latch circuit XDL<e1> is transmitted to the latch circuit SDL<o2>. Specifically, for example, in the address ADD3, "101" is designated as identification information of a latch circuit which is a transmission source, and "00" is designated as in-page region identification information. "100" is designated as identification information of a latch circuit which is a transmission destination, and "11" is designated as in-page region identification information. Consequently, the latch circuit XDL<e1> transitions to an overwritable state.

In the data saving operation, the lower data stored in the latch circuit ADL<e1> is transmitted to the latch circuit SDL<o1>. Specifically, for example, in the address ADD3, "000" is designated as identification information of a latch circuit which is a transmission source, and "00" is designated as in-page region identification information. "100" is designated as identification information of a latch circuit which is a transmission destination, and "10" is designated as in-page region identification information. Consequently, the latch circuit ADL<e1> transitions to an overwritable state.

In the data saving operation, the lower data stored in the latch circuit BDL<e1> is transmitted to the latch circuit SDL<e2>. Specifically, for example, in the address ADD3, "001" is designated as identification information of a latch circuit as a transmission source, and "00" is designated as in-page region identification information. "100" is designated as identification information of a latch circuit which is a transmission destination, and "01" is designated as in-page region identification information. Consequently, the latch circuit BDL<e1> transitions to an overwritable state.

Through the above-described data saving operation, the four latch circuit XDL<e1>, ADL<e1>, BDL<e1> and SDL<e1> in a region of the ¼ page transition to an overwritable state.

In a read operation after the data saving operation, data required in reading is stored in the latch circuits XDL<e1>, ADL<e1>, BDL<e1> and SDL<e1>. Specifically, read option data is stored in the latch circuits XDL<e1>, ADL<e1> and BDL<e1>, and read data which is to be read out to the controller 10 is stored in the latch circuit SDL<e1>.

In a data restoring operation, first, middle data stored in the latch circuit SDL<e2> is transmitted to the latch circuit BDL<e1>. Specifically, for example, in the address ADD3, "100" is designated as identification information of a latch circuit which is a transmission source, and "01" is designated as in-page region identification information. "001" is designated as identification information of a latch circuit which is a transmission destination, and "00" is designated as in-page region identification information. Consequently, the middle data in the latch circuit BDL is restored into a state before the data saving operation.

Next, in a data restoring operation, lower data stored in the latch circuit SDL<o1> is transmitted to the latch circuit ADL<e1>. Specifically, for example, in the address ADD3, "100" is designated as identification information of a latch circuit which is a transmission source, and "10" is designated as in-page region identification information. "000" is designated as identification information of a latch circuit which is a transmission destination, and "00" is designated as in-page region identification information. Consequently, the lower data in the latch circuit ADL is restored into a state before the data saving operation.

Next, in a data restoring operation, cache data stored in the latch circuit SDL<o2> is transmitted to the latch circuit XDL<e1>. Specifically, for example, in the address ADD3, "100" is designated as identification information of a latch circuit which is a transmission source, and "11" is designated as in-page region identification information. "101" is designated as identification information of a latch circuit which is a transmission destination, and "00" is designated as in-page region identification information. Consequently, the cache data in the latch circuit XDL is restored into a state before the data saving operation.

Thereafter, writing instruction data is generated through a calculation process based on the lower data, the middle data, and the upper data prior to resuming of a write operation, and is stored in the latch circuit SDL. The data items in the latch circuits XDL, ADL, BDL, CDL, DDL and SDL are all restored through the above-described data restoring operation.

3.3 Effects Related to the Present Embodiment

According to the third embodiment, the sequencer 25 causes data held in the latch circuits ADL<e1> and BDL<e1> of the sense amplifier unit SAU<e1> and the latch circuit XDL<e1> to be held in the latch circuit SDL<e2> of the sense amplifier unit SAU<e2>, the latch circuit SDL<o1> of the sense amplifier unit SAU<o1>, and the latch circuit SDL<o2> of the sense amplifier unit SAU<o2> after a write operation is suspended and before a reading command is received. Consequently, in a stage in which the reading command is executed, some data required to resume the write operation is saved to the outside of the sense amplifier unit SAU<e1>. Thus, the latch circuits XDL, ADL and BDL from which data is saved can hold read option data.

During a read operation, the sequencer 25 causes read option data which is read from the memory cell transistor MT to be held in the latch circuit XDL<e1> and the latch circuits ADL and BDL of the sense amplifier unit SAU<e1> from which data is saved. The data in the latch circuits XDL, ADL and BDL is overwritten with the read option data, but the overwritten data is already saved to the sense amplifier units SAU<o2>, SAU<o1> and SAU<e2> and can thus be restored through a subsequent restoring operation. Therefore, a latch circuit holding data required to resume a write operation can be used in a read operation during suspension of the write operation.

The sequencer 25 transmits the data transmitted to the latch circuit SDL<e2> of the sense amplifier unit SAU<e2>, the latch circuit SDL<o1> of the sense amplifier unit SAU<o1>, and latch circuit SDL<o2> of the sense amplifier unit SAU<o2>, to the latch circuits BDL<e1> and ADL<e1> of the sense amplifier unit SAU<e1> and the latch circuit XDL<e1>, respectively, after the read operation is finished and before the command "YYh" for resuming the write operation is received. Consequently, data required to resume a write operation can be restored to a latch circuit holding the data, before a write operation is resumed. Therefore, a read operation can be performed by using a latch circuit in which data required to resume a write operation is held, and then the write operation can be resumed.

As described above, data which is held in the latch circuit BDL<e1> and the latch circuit ADL<e1> of the sense amplifier unit SAU<e1> and the latch circuit XDL<e1> and is required to resume a write operation is saved to the latch circuit SDL<e2> of the sense amplifier unit SAU<e2>, the latch circuit SDL<o1> of the sense amplifier unit SAU<o1>, and the latch circuit SDL<o2> of the sense amplifier unit SAU<o2>. Thus, if data is read out to the sense amplifier units SAU<e2>, SAU<o1> and SAU<o2> during a read operation, there is a probability that the saved data may be overwritten with the read data and may thus be lost. In the third embodiment, the controller 10 matches a value of in-page region identification information in the address ADD4 with a value of in-page region identification information of a transmission source in the address ADD3 in a read operation. In the above-described way, read data is held in a portion which does not receive save data from the latch circuit SDL. As mentioned above, reading-out of data to the sense amplifier units SAU<e2>, SAU<o1> and SAU<o2> is restricted. Thus, save data can be prevented from being lost due to reading of data. Therefore, a write operation can be resumed after a read operation.

In a read operation, data with a size of a ¼ page is read. Specifically, the sense amplifier units SAU of the sense amplifier module 28 include the sense amplifier units SAU<e1>, SAU<e2>, SAU<o1> and SAU<o2> of the same number. Consequently, if reading-out of data to the sense amplifier units SAU<e2>, SAU<o1> and SAU<o2> is restricted while a read operation is performed on the sense amplifier unit SAU<e1>, data of ¼ (4 KB) of a data size (16 KB) corresponding to a case where a read operation is performed on all of the sense amplifier units SAU can be read.

The sequencer 25 receives the command "ZZh" and then receives the address ADD3. The sequencer 25 specifies a transmission source and a transmission destination in a transmission operation between latch circuits on the basis of the address ADD3. Consequently, data transmission between any latch circuits among the latch circuits ADL, BDL, CDL, DDL, SDL and XDL of the sense amplifier module 28 can be easily performed.

3.4 Modification Examples of Third Embodiment

The semiconductor memory device according to the third embodiment is not limited to the above-described example, and may be modified.

For example, in the semiconductor memory device according to the third embodiment, during data transmission between latch circuits in a data saving operation and a data restoring operation, the command "ZZh" and the address ADD3 are issued, but any other method may be employed. Specifically, there may be a configuration in which only the command is issued without issuing the address ADD3, and thus data transmission in which latch circuits as a transmission source and a transmission destination are pre-designated is performed, in the same manner as in the modification examples of the first and second embodiments.

Figure 29:
FIG. 29 is a command sequence for a data saving operation for the semiconductor memory device according to a modification example of the third embodiment.

FIG. 29 is a command sequence for a data saving operation for the semiconductor memory device according to a modification example of the third embodiment. As illustrated in FIG. 29, the controller 10 issues a command "Z0qsh", and transmits the command to the semiconductor memory device 20. The command "Z0qsh" is used to instruct data to be transmitted from, for example, the latch circuit XDL<e1> to the latch circuit SDL<o2>. If the command "Z0qsh" is stored in the register 24, the sequencer 25 transmits data from the latch circuit XDL<e1> to the latch circuit SDL<o2>. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

Next, the controller 10 issues a command "Z1qsh", and transmits the command to the semiconductor memory device 20. The command "Z1qsh" is used to instruct data to be transmitted from, for example, the latch circuit ADL<e1> to the latch circuit SDL<o1>.

Next, the controller 10 issues a command "Z2qsh", and transmits the command to the semiconductor memory device 20. The command "Z2qsh" is used to instruct data to be transmitted from, for example, the latch circuit BDL<e1> to the latch circuit SDL<e2>.

As mentioned above, the data saving operation is finished.

Figure 30:
FIG. 30 is a command sequence for a data restoring operation for the semiconductor memory device according to a modification example of the third embodiment.

FIG. 30 is a command sequence for a data restoring operation for the semiconductor memory device according to a modification example of the third embodiment.

As illustrated in FIG. 30, the controller 10 issues a command "Z2qrh" and transmits the command to the semiconductor memory device 20. The command "Z2qrh" is used to instruct data to be transmitted from, for example, the latch circuit SDL<e2> to the latch circuit BDL<e1>. If the command "Z2qrh" is stored in the register 24, the sequencer 25 transmits the data from the latch circuit SDL<e2> to the latch circuit BDL<e1>. At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

Next, the controller 10 issues a command "Z1qrh" and transmits the command to the semiconductor memory device 20. The command "Z1qrh" is used to instruct data to be transmitted from, for example, the latch circuit SDL<o1> to the latch circuit ADL<e1>.

Next, the controller 10 issues a command "Z0qrh" and transmits the command to the semiconductor memory device 20. The command "Z0qrh" is used to instruct data to be transmitted from, for example, the latch circuit SDL<o2> to the latch circuit XDL<e1>.

As mentioned above, the data restoring operation is finished.

According to the modification example of the third embodiment, a data saving operation and a data restoring operation can be performed according to a simpler command sequence. This effect will be described below.

If data transmission between any latch circuits is expected, as described in the third embodiment, latch circuits as a transmission source and a transmission destination are effectively specified by issuing the command "ZZh" and then issuing the address ADD3. If latch circuits between which data transmission is performed are specified, the same information is normally included in the address ADD3. The information which does not change every time is preferably omitted.

According to the semiconductor memory device of the modification example of the third embodiment, the data saving operation is performed by receiving the commands "Z0qsh", "Z1qsh" and "Z2qsh" without receiving the address ADD3. Similarly, the data restoring operation is performed by receiving the commands "Z0qrh", "Z1qrh" and "Z2qrh" without receiving the address ADD3. Consequently, issuing of the address ADD3 can be omitted. Thus, a data saving operation and a data restoring operation can be performed more simply at a high speed, and a user's convenience can be expected to be improved.

4. Fourth Embodiment

Next, a description will be made of a semiconductor memory device of a fourth embodiment. In the semiconductor memory device according to the fourth embodiment, a read operation is performed without performing a data saving operation, and lost write information is restored through a data restoring operation. In the following description, the same constituent elements as the constituent elements in the first embodiment are given the same reference numerals, description thereof will be omitted, and only differences from the first embodiment will be described.

4.1 Summary of Write Operation Interrupted by Read Operation

Figure 31:
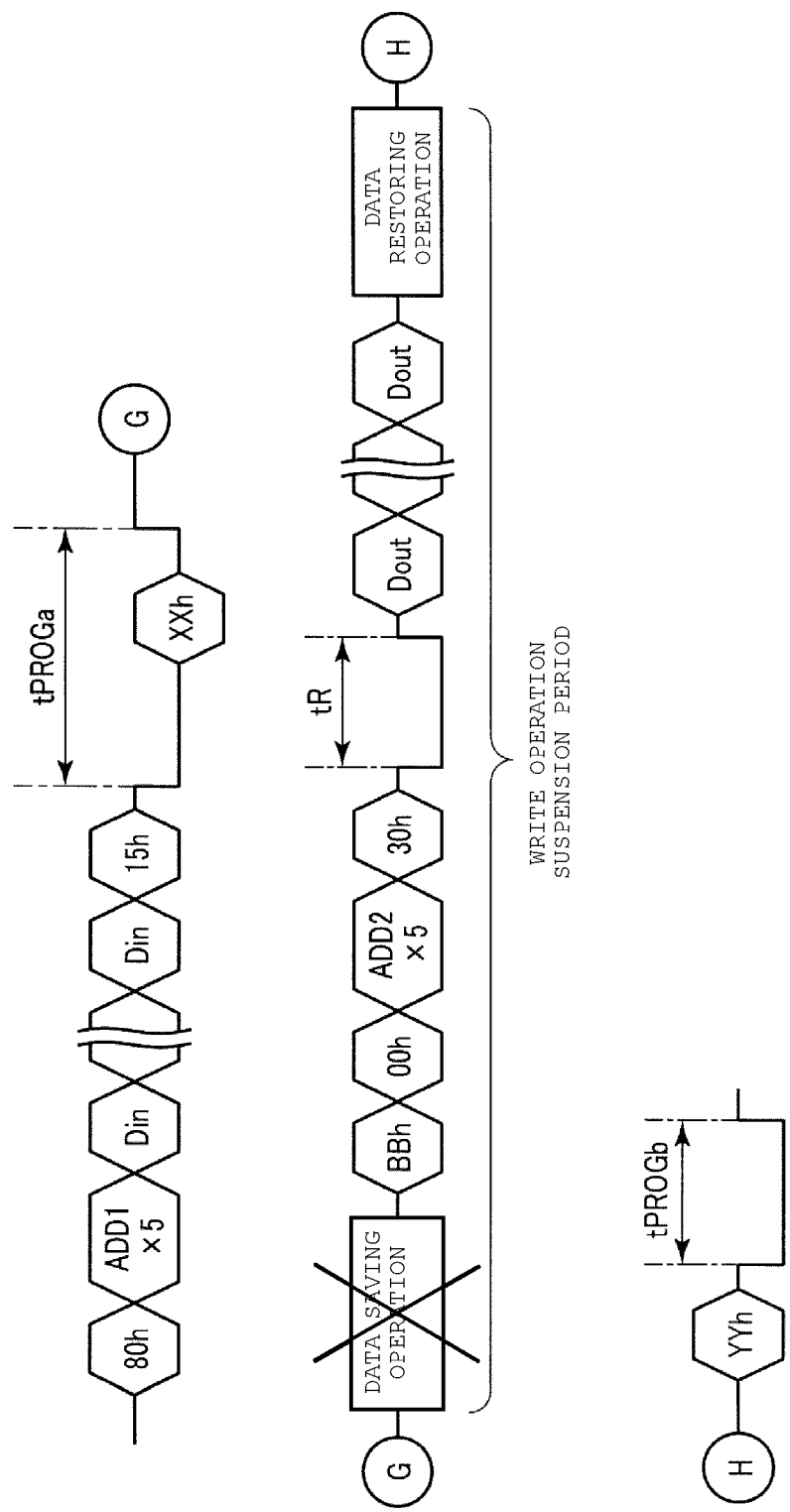
FIG. 31 is a command sequence for a write operation interrupted by a read operation for a semiconductor memory device according to a fourth embodiment.

A description will be made of a summary of a write operation interrupted by a read operation for the semiconductor memory device according to the fourth embodiment. FIG. 31 is a command sequence illustrating a summary of a write operation interrupted by a read operation for the semiconductor memory device according to the fourth embodiment.

As illustrated in FIG. 31, a sequence until a write operation is suspended is the same as in the first embodiment, and thus a description thereof will be omitted.

After the write operation is suspended, the same read operation as in the first embodiment is performed without performing a data saving operation. In the read operation, data held in used latch circuits among the latch circuits XDL, ADL, BDL, CDL, DDL and SDL is lost by overwriting. The data read operation is performed, and then a data restoring operation is performed. Details of the data restoring operation will be described later.

The subsequent sequence for performing a writing resuming operation is the same as in the first embodiment, and a description thereof will be omitted. In the above-described way, the write operation interrupted by the read operation is finished.

4.2 Data Restoring Operation

Next, a description will be made of a data restoring operation for the semiconductor memory device according to the fourth embodiment. In the following description of the fourth embodiment, the description will be made of a data restoring operation in which a read operation using three latch circuits XDL, ADL and SDL is performed, and data is restored into a state before the read operation is performed.

Figure 32:
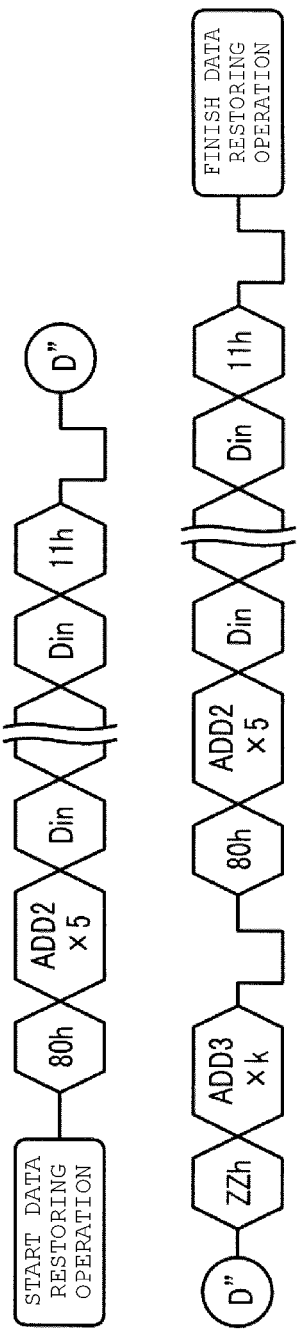
FIG. 32 is a command sequence for a data restoring operation for the semiconductor memory device according to the fourth embodiment.

FIG. 32 is a command sequence for a data restoring operation for the semiconductor memory device according to the fourth embodiment. The command sequence illustrated in FIG. 32 is the same as the command sequence illustrated in FIG. 14 in the first embodiment, but the content of the write data Din is different from the content thereof in the first embodiment.

As illustrated in FIG. 32, the controller 10 issues a command "80h", and transmits the command to the semiconductor memory device 20. The controller 10 issues an address ADD2, for example, over five cycles, and transmits the address ADD2 to the semiconductor memory device 20. Next, the controller 10 transmits the write data Din to the semiconductor memory device 20. The write data Din is, for example, lower data which is transmitted from the controller 10 to the semiconductor memory device 20 when the write operation is initially instructed to be performed. In other words, the lower data does not include a result of verification which is performed until the write operation is suspended. The controller 10 issues a command "11h" and transmits the command to the semiconductor memory device 20. If the command "11h" is stored in the register 24, the sequencer 25 completes writing of the lower data not including the verification result into the latch circuit XDL. At this time, the logic control circuit 23 sets the signal /RB to an "L" level so as to notify the controller 10 that the semiconductor memory device 20 is in a busy state. After writing of the lower data into the latch circuit XDL is completed, the logic control circuit 23 sets the signal /RB to an "H" level so as to notify the controller 10 that the semiconductor memory device 20 is in a ready state.

The controller 10 issues a command "ZZh" and transmits the command to the semiconductor memory device 20. The controller 10 issues an address ADD3, for example, over k cycles, and transmits the address ADD3 to the semiconductor memory device 20. If the command "ZZh" is stored in the register 24, the sequencer 25 performs data transmission between the latch circuits. Specifically, for example, "101" is designated as identification information of a latch circuit which is a transmission source of the address ADD3, and "000" is designated as identification information of a latch circuit which is a transmission destination. Consequently, the sequencer 25 transmits the lower data stored in the latch circuit XDL to the latch circuit ADL.

At this time, the logic control circuit 23 sets the signal /RB to an "L" level so as to notify the controller 10 that the semiconductor memory device 20 is in a busy state. If the data transmission is completed, the logic control circuit 23 sets the signal /RB to an "H" level so as to notify the controller 10 that the semiconductor memory device 20 is in a ready state.

For example, in the same manner as in the operation after the data restoring operation is started, the controller 10 sequentially issues the command "80h", the address ADD2, the write data Din, and the command "11h", and transmits the commands and the data to the semiconductor memory device 20. The write data Din here is, for example, cache data stored in the buffer memory 14 in advance. The sequencer 25 writes the cache data into the latch circuit XDL.

As mentioned above, the data restoring operation is finished.

In the example illustrated in FIG. 32, a description was made of a case where data lost from the latch circuit ADL is held in the same data allocation as the write data Din which is input from the controller 10, but any other method may be employed. For example, if data lost from the latch circuit ADL is held in data allocation which is different from allocation of the write data Din which is input from the controller 10, the controller 10 performs a data restoring operation of inputting middle data and upper data into the latch circuits BDL and CDL before inputting cache data into the latch circuit XDL. The data restoring operation of the middle data and the upper data into the latch circuits BDL and CDL is the same as the data restoring operation of the lower data into the latch circuit ADL except for identification information of a latch circuit which is a transmission destination. After data restoring operations on all data are completed, a data allocation converting operation (not illustrated) is performed, and thus final data can be restored.

Figure 33:
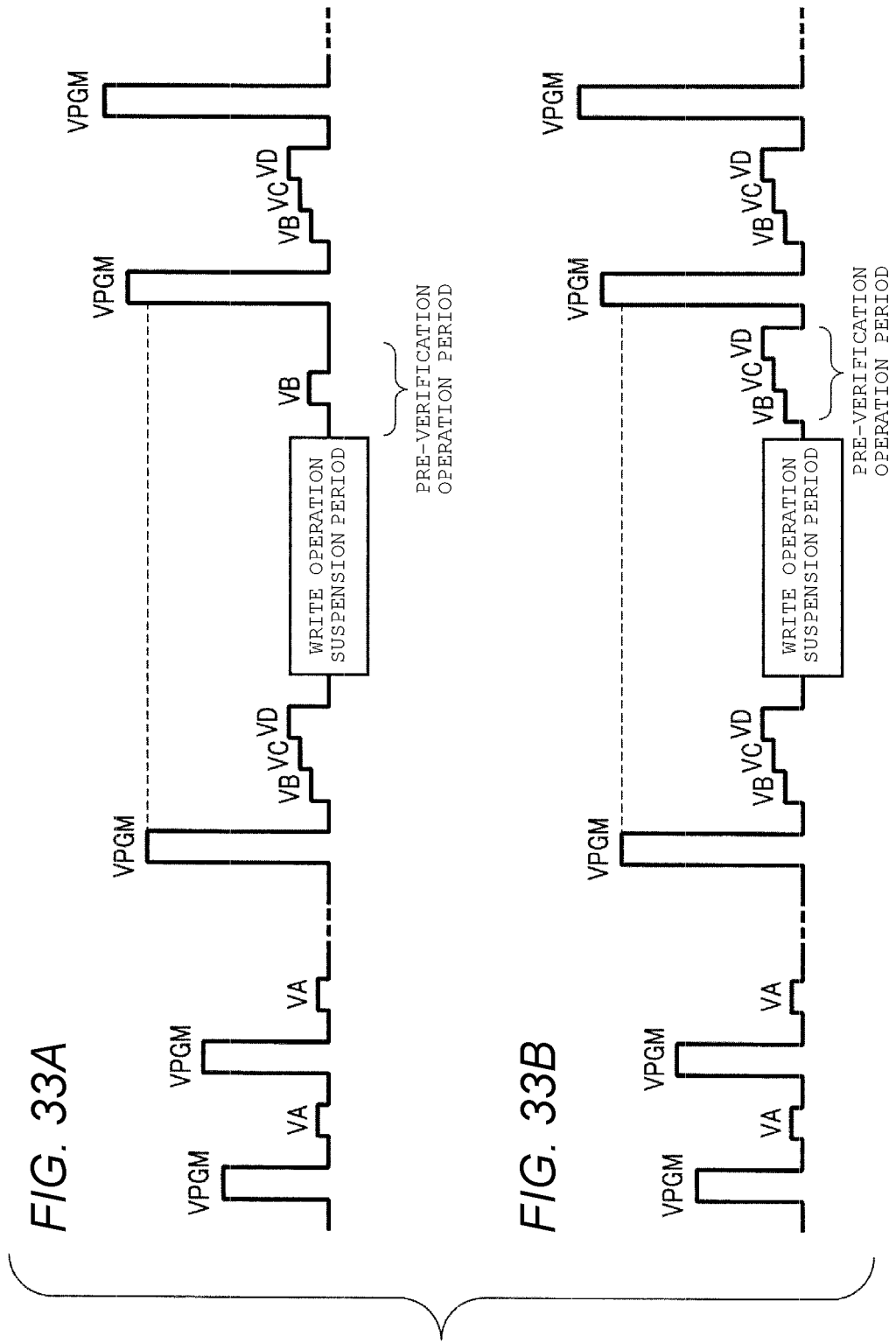
FIGS. 33A and 33B are timing charts of voltages applied to a selected word line before and after a write operation suspension period in the semiconductor memory device according to the fourth embodiment.

FIGS. 33A and 33B are timing charts for explaining a write operation interrupted by a read operation for the semiconductor memory device according to the fourth embodiment. FIGS. 33A and 33B illustrate magnitudes of voltages applied to a selected word line WL in a write operation before and after the write operation suspension period.

As illustrated in FIGS. 33A and 33B, voltages are applied to the selected word line WL in the same manner as in FIGS. 10A to 10C in the first embodiment until the write operation suspension period is finished.

In the examples illustrated in FIGS. 33A and 33B, a pre-verification operation is performed after the write operation suspension period is finished and before a loop of the write operation is resumed. The pre-verification operation is used to understand to what extent a threshold voltage of the memory cell transistor MT increases before the write operation is suspended. In the fourth embodiment, data including a verification result before suspension of the write operation is lost in the write operation suspension period. Thus, the pre-verification operation is required to be performed when the write operation is resumed.

As described above, the register 24 holds information indicating levels which passed verification during the write operation. In the pre-verification operation, a verification voltage is applied on the basis of the information held in the register 24. In the example illustrated in FIG. 33A, verification of the "A" level is passed immediately before the write operation is suspended. Thus, in the pre-verification operation, a verification result can be restored by checking whether or not a threshold voltage of each memory cell transistor MT reaches the "B" level. Therefore, in the example illustrated in FIG. 33A, the verification voltage VB is applied in the pre-verification operation. A result of performing the pre-verification operation is reflected in data which is received from the controller 10 when a data restoring operation is performed, and thus data including a verification result before suspension of the write operation is restored.

In the example illustrated in FIG. 33A, the pre-verification operation on only the "B" level was described, but is not limited thereto. For example, as illustrated in FIG. 33B, the pre-verification operation may be performed on the "C" level and the "D" level in addition to the "B" level. In this case, in the pre-verification operation, the verification voltage VB is applied, and then the verification voltages VC and VD are consecutively applied. Consequently, even if writing for a higher level is completed, data including a verification result before suspension of a write operation can be restored.

After the pre-verification operation, a loop of the write operation is resumed in the same manner as in FIGS. 10A to 10C in the first embodiment.

FIG. 34 is a table illustrating an example of changes in data in the latch circuits before and after a data reading operation and during and after a data restoring operation for the semiconductor memory device according to the fourth embodiment. FIG. 34 illustrates changes in data in the latch circuits in the row direction from a time before a data reading operation is started to a time after the data restoring operation.

As illustrated in FIG. 34, before the data reading operation is started (immediately after a write operation is suspended), cache data, lower data, middle data, upper data, data Q, and overwritable writing instruction data are respectively stored in the latch circuits XDL, ADL, BDL, CDL, DDL and SDL.

In a data read operation, read data and read option data are stored in the latch circuits SDL, XDL and ADL. The read data which is read out to the latch circuit SDL is output to the controller 10 via the latch circuit XDL.

In a data restoring operation, cache data and lower data stored in the buffer memory 14 are respectively transmitted to the latch circuits XDL and ADL. However, the lower data transmitted to the latch circuit ADL does not include a verification result before suspension of the write operation (the data is given "(NUP)" so as to be differentiated from other data in FIG. 34).

Thereafter, a pre-verification operation is performed before a loop of the write operation is resumed. Specifically, lower data including a verification result before suspension of the write operation is generated and is stored in the latch circuit ADL.

Writing instruction data is generated through a calculation process based on the lower data, the middle data, and the upper data prior to resuming of a write operation, and is stored in the latch circuit SDL. The data items in the latch circuits XDL, ADL, BDL, CDL, DDL and SDL are all restored through the above-described data restoring operation.

4.3 Effects Related to the Present Embodiment

According to the fourth embodiment, the sequencer 25 overwrites read data and read option data on data which is held in latch circuits and is required to resume a write operation in a read operation. Consequently, the read operation can be performed without performing a data saving operation. On the other hand, since the data saving operation is not performed, information regarding a situation of writing data into the memory cell transistor MT before suspension of a write operation disappears. In other words, after the read operation is finished, the latch circuits do not hold data which is required to resume the write operation. Therefore, in the fourth embodiment, the sequencer 25 causes data to be written into the memory cell transistor MT to be written into the latch circuits again in a data restoring operation. Consequently, data to be finally written into the memory cell transistor MT in the write operation can be restored.

However, information regarding a threshold voltage level written into the memory cell transistor MT before suspension of the write operation is not present in the latch circuit. Therefore, in the fourth embodiment, the sequencer 25 performs a pre-verification operation after the write operation is resumed and before an initial loop is started. Thus, information regarding a threshold voltage level written into the memory cell transistor MT can be restored to the latch circuit. Consequently, when a loop of the write operation is executed, an erroneous write operation in which a writing voltage is further applied to the memory cell transistor MT on which writing is already completed can be prevented.

In order to restore data, the controller 10 is required to hold write data which is transmitted to the semiconductor memory device 20 when a write operation is started. Consequently, even if a read operation is required to be suddenly performed during a write operation, the sequencer 25 can perform the above-described data restoring operation.

4.4 Modification Examples of Fourth Embodiment

The semiconductor memory device according to the fourth embodiment is not limited to the above-described example, and may be modified.

For example, in the fourth embodiment, a read operation may be performed without performing a data saving operation, and a write operation may be resumed without performing a data restoring operation. Specifically, a modification example of the fourth embodiment is applied to, for example, a case where not only read data but also read option data corresponding to a single latch circuit is required to be generated. In the following description of the modification example of the fourth embodiment, the description will be made assuming that a read operation is performed by using two latch circuits ADL and SDL.

Figure 35:
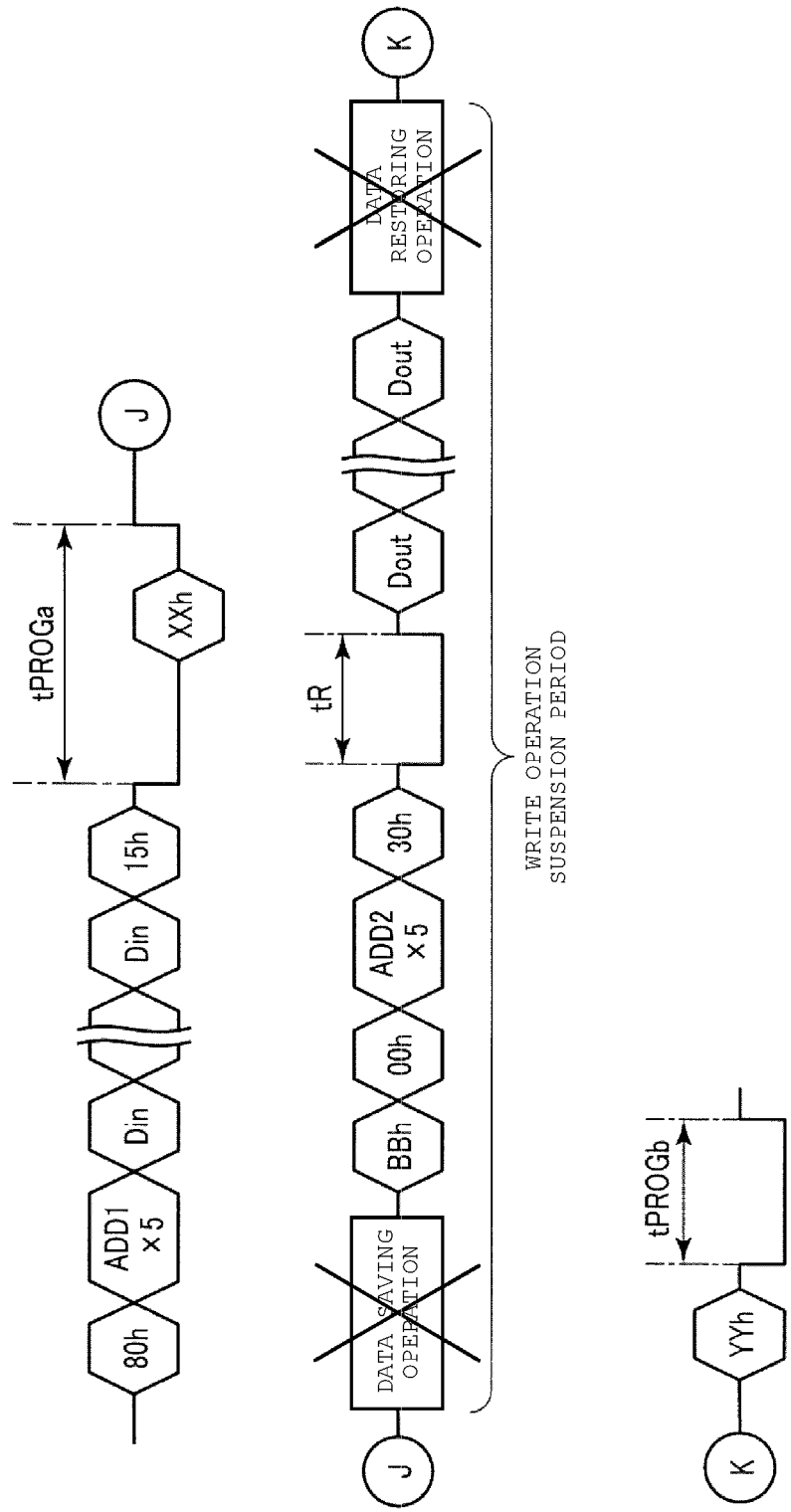
FIG. 35 is a command sequence for a write operation interrupted by a read operation for the semiconductor memory device according to a modification example of the fourth embodiment.

FIG. 35 is a command sequence illustrating a summary of a write operation interrupted by a read operation for the semiconductor memory device according to the modification example of the fourth embodiment.

As illustrated in FIG. 35, a sequence until a write operation is suspended is the same as in the first embodiment, and thus a description thereof will be omitted.

After the write operation is suspended, the same read operation as in the first embodiment is performed without performing a data saving operation. After the data read operation is performed, the same writing resuming operation as in the first embodiment is performed without performing a data restoring operation.

Figures 36, 37, 38:
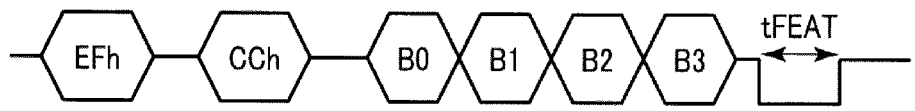
FIG. 36 is a table showing changes in data in the latch circuits during a write operation suspension period in the semiconductor memory device according to a modification example of the fourth embodiment.
FIG. 37 is a command sequence for a set feature operation for the semiconductor memory device according to other modification examples.
FIG. 38 is a table showing a data saving location that can be set through the set feature operation in the semiconductor memory device according to another modification examples.

FIG. 36 is a table illustrating an example of changes in data in the latch circuits during the writing suspension period and after one loop of the resumed write operation in the semiconductor memory device according to the modification example of the fourth embodiment. FIG. 36 illustrates changes in data in the latch circuits in the row direction from a start of the writing suspension period to after one loop of the resumed write operation is completed.

As illustrated in FIG. 36, immediately after a write operation is suspended, cache data, lower data, middle data, upper data, data Q, and overwritable writing instruction data are respectively stored in the latch circuits XDL, ADL, BDL, CDL, DDL and SDL.

In a data read operation, read data and read option data are stored in the latch circuits SDL and DDL, respectively. The read data which is read out to the latch circuit SDL is output to the controller 10 via the latch circuit XDL.

In a first loop of a write operation after being resumed, a program operation is performed without taking the data Q into consideration. The data Q is generated on the basis of a verification result in the first loop. The generated data Q is stored in the latch circuit DDL. The data items in the latch circuits XDL, ADL, BDL, CDL, DDL and SDL are all restored through the above-described operation. In a second loop and the subsequent loops, a first write operation is performed.

According to the semiconductor memory device of the modification example of the fourth embodiment, the sequencer 25 overwrites read option data into the latch circuit DDL storing the data Q in a read operation. The data Q can narrow a distribution of a threshold voltage in a write operation but is not necessarily required to resume the write operation. Thus, in the first loop after the write operation is resumed, the first write operation using the data Q cannot be performed, but the sequencer 25 can resume the write operation without performing a data restoring operation and a pre-verification operation. The lost data Q can be restored on the basis of a verification result when the first loop after resuming of the write operation is finished. Thus, in a write operation after a second loop and the subsequent loops after resuming thereof, the first write operation can be performed.

If the first write operation is desired to be performed from the first loop after resuming of the write operation, a pre-verification operation may be performed.

5. Other Modification Examples

Embodiments are not limited to the first to fourth embodiments, and may be modified.

5.1 First Modification Example

A description will be made of a semiconductor memory device according to a first modification example. The semiconductor memory device according to the first modification example receives a set feature command in advance so as to set a location for saving data related to a data saving operation to the controller 10 or the sense amplifier unit SAU. The semiconductor memory device according to the first modification example has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

FIG. 37 is a command sequence for explaining a set feature operation for the semiconductor memory device according to the first modification example. The set feature operation illustrated in FIG. 37 is performed in advance, for example, before a write operation is performed.

As illustrated in FIG. 37, the controller 10 issues a command "EFh", and transmits the command to the semiconductor memory device 20. The command "EFh" is used to instruct the semiconductor memory device 20 to perform feature setting, for example. The feature setting is, for example, an operation of changing parameters defining various operations of the semiconductor memory device 20. Next, the controller 10 issues a command "CCh" and transmits the command to the semiconductor memory device 20. The command "CCh" is used to give an instruction for setting a location for saving data related to a data saving operation.

The controller 10 issues data B0 to B3, for example, over four cycles, and transmits the data to the semiconductor memory device 20. The data B0 to B3 sets, for example, whether a location for saving data related to a data saving operation is the controller 10 or the sense amplifier unit SAU. Next, the logic control circuit 23 sets the signal /RB to an "L" level so as to notify the controller 10 that the semiconductor memory device 20 is in a busy state. A period tFEAT in which the semiconductor memory device 20 is in a busy state indicates a period in which a set feature operation is performed. The set location for saving data related to a data saving operation is updated in the period tFEAT.

FIG. 38 is a table illustrating an example of information for setting a data saving location in the set feature operation for the semiconductor memory device according to the first modification example. The information for setting a data saving location illustrated in FIG. 38 is included in, for example, the data B0 to B3. As illustrated in FIG. 38, the information for setting a data saving location includes a data saving location setting information. Specifically, for example, the data saving location setting information is "0" if the controller 10 is set as a data saving location, and is "1" if the sense amplifier unit SAU is set as a data saving location.

The semiconductor memory device according to the first modification example receives the set feature command so as to set a location for saving data related to a data saving operation. Consequently, if the location is set in advance, the sequencer 25 can determine in advance whether or not in-page region identification information is set in the address ADD3 after the command "ZZh" is received. Thus, whether the controller 10 or the sense amplifier unit SAU is set as a data saving location can be used properly while using the same command "ZZh". Therefore, a load on the controller 10 side can be reduced.

5.2 Second Modification Example

In the first modification example, a data saving location is set through the set feature operation, but a method of setting a data saving location is not limited thereto. As in a second modification example described below, information for setting whether a location for saving data related to a data saving operation is the controller 10 or the sense amplifier unit SAU may be included in the address ADD3. The semiconductor memory device according to the second modification example has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

FIG. 39 is a table illustrating an example of information for setting data transmission between latch circuits of the semiconductor memory device according to the second modification example. The information for setting data transmission between latch circuits illustrated in FIG. 39 is included in, for example, the address ADD3. As illustrated in FIG. 39, the information for setting data transmission between latch circuits includes data saving location setting information, identification information of latch circuits which are a transmission source and a transmission destination, and in-page region identification information as necessary. The identification information of latch circuits which are a transmission source and a transmission destination is not used if the data saving location setting information is "0", that is, a data saving location is the controller 10 in a data saving operation. The in-page region identification information is set if the data saving location setting information is "1", that is, a data saving location is the sense amplifier unit SAU in a data saving operation.

As mentioned above, in the semiconductor memory device according to the second modification example, the data saving location setting information is included in the address ADD3. Consequently, a data saving location in a data saving operation can be flexibly selected depending on situations. The controller 10 is not required to issue the set feature command in advance, and thus procedures required on a user side can be reduced.

The semiconductor memory device according to the second modification example is not limited to the example illustrated in FIG. 39, and is applicable to a case where data is saved to a plurality of sense amplifier units SAU as described in the third embodiment as illustrated in FIG. 40.

The data saving location setting information, the in-page region identification information, and the latch circuit identification information may be held in different data blocks in the address ADD3. In this case, the in-page region identification information and the latch circuit identification information may be held in different data blocks for each transmission source or transmission destination.

5.3 Third Modification Example

In the semiconductor memory devices according to the above-described first to fourth embodiments and first and second modification examples, a case of a single plane was described, but any other plane may be employed. For example, as a third modification example, the semiconductor memory device 20 may have a multi-plane configuration in which writing is simultaneously performed on two memory cell arrays 21 in a single write operation. For example, the semiconductor memory device having the multi-plane configuration can selectively drive two sense amplifier modules 28 in response to an instruction from a single sequencer 25, and can selectively perform data writing and reading on either of two memory cell arrays 21. As mentioned above, if a read operation during suspension of a write operation is performed on any one of planes, on which plane a data saving operation and a data restoring operation are performed is required to be designated. In the following description, the description will be made assuming that the semiconductor memory device 20 according to the third modification example is configured to include two planes (a plane 0 and a plane 1).

FIG. 41 is a table illustrating an example of information for setting data transmission between latch circuits of the semiconductor memory device according to the third modification example. The information for setting data transmission between latch circuits illustrated in FIG. 41 is included in, for example, the address ADD3.

As illustrated in FIG. 41, the information for setting data transmission between latch circuits includes identification information of latch circuits which are a transmission source and a transmission destination, in-page region identification information, and plane selection information. The plane selection information is "00", for example, if only the plane 0 is selected as a target for performing a data saving operation and a data restoring operation, and is "01" if only the plane 1 is selected. The plane selection information is "10" in a case of a multi-plane in which both of the plane 0 and the plane 1 are selected.

The semiconductor memory device according to the third modification example is not limited to the example illustrated in FIG. 41, and is applicable to a case where data is saved to a plurality of sense amplifier units SAU as described in the third embodiment as illustrated in FIG. 42.

As mentioned above, in the semiconductor memory device according to the third modification example, the plane selection information is included in the address ADD3. Consequently, even if a write operation on multiple planes is suspended, data can be read from any one of the multiple planes.

5.4 Others

In the respective embodiments and the respective modification examples, the following configurations may be employed.

In a multi-value read operation (read), a voltage applied to a selected word line in an A-level read operation is in a range of, for example, 0 V to 0.55 V. There is no limitation to this range, and the voltage may be in any one of ranges of 0.1 V to 0.24 V, 0.21 V to 0.31 V, 0.31 V to 0.4 V, 0.4 V to 0.5 V, and 0.5 V to 0.55 V.

A voltage applied to a selected word line in an B-level read operation is in a range of, for example, 1.5 V to 2.3 V. There is no limitation to this range, and the voltage may be in any one of ranges of 1.75 V to 1.8 V, 1.8 V to 1.95 V, 1.95 V to 2.1 V, and 2.1 V to 2.3 V.

A voltage applied to a selected word line in a C-level read operation is in a range of, for example, 3.0 V to 4.0 V. There is no limitation to this range, and the voltage may be in any one of ranges of 3.0 V to 3.2 V, 3.2 V to 3.4 V, 3.4 V to 3.5 V, 3.5 V to 3.7 V, and 3.7 V to 4.0 V.

The time (tR) for a read operation may be in a range of, for example, 25 μs to 38 μs, 38 μs to 70 μs, and 70 μs to 80 μs.

A write operation includes a program operation and a verification operation. In the write operation, a voltage which is initially applied to a selected word line during the program operation is in a range of, for example, 13.7 V to 14.3 V. There is no limitation to this range, and the voltage may be in either one of ranges of 13.7 V to 14.0 V, and 14.0 V to 14.7 V.

A voltage which is initially applied to a selected word line when data is written into even-numbered word lines may be replaced with a voltage which is initially applied to a selected word line when data is written into odd-numbered word lines.

If a program operation is performed according to an incremental step pulse program (ISPP) method, a step-up voltage is, for example, about 0.5 V.

A voltage which is applied to a non-selected word line may be in a range of, for example, 7.0 V to 7.3 V. There is no limitation to this range, and the voltage may be in a range of, for example, 7.3 V to 8.4 V, and may be equal to or lower than 7.0 V.

A pass voltage to be applied may be changed depending on whether a non-selected word line is an odd-numbered word line or an even-numbered word line.

The time (tProg) for a write operation may be any one of, for example, 1700 μs to 1800 μs, 1800 μs to 1900 μs, and 1900 μs to 2000 μs.

In an erasing operation, a voltage applied to a well which is formed on an upper part in a semiconductor substrate and over which a memory cell is disposed is in a range of, for example, 12 V to 13.7 V. There is no limitation to this range, and the voltage may be in any one of ranges, for example, 13.7 V to 14.8 V, 14.8 V to 19.0 V, 19.0 V to 19.8 V, and 19.8 V to 21 V.

The time (tErase) for the erasing operation may be in any one of ranges of, for example, 3000 μs to 4000 μs, 4000 μs to 5000 μs, and 4000 μs to 9000 μs.

The memory cell has the charge storage layer which is disposed on the semiconductor substrate (silicon substrate) via the tunnel insulating film having a thickness of 4 to 10 nm. The charge storage layer may have a stacked structure in which an insulating film, for example, SiN or SiON having a film thickness of 2 to 3 nm, and polysilicon having a film thickness of 3 to 8 nm are stacked. Polysilicon may contain a metal such as Ru. The insulating film is formed on the charge storage layer. The insulating film includes a silicon oxide film having a thickness of 4 to 10 nm interposed between a lower-layer high-k film having a thickness of 3 to 10 nm and an upper-layer high-k film having a thickness of 3 to 10 nm. The high-k film may be an HfO film. A thickness of the silicon oxide film may be larger than a thickness of the high-k film. A control electrode having a film thickness of 30 nm to 70 nm is provided on the insulating film via a material having a film thickness of 3 to 10 nm. Such a material is a metal oxide film such as TaO, or a metal nitride film such as TaN. The control electrode may be a metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   memory cells;
   a sense amplifier unit including a first latch circuit and a second latch circuit; and
   a control unit configured to execute a read operation and a write operation on the memory cells, wherein the control unit, while executing the write operation on the memory cells and responsive to a write suspend command followed by a read command, performs a data saving operation, the read operation, and a data restoring operation prior to resuming the write operation, wherein the data saving operation includes (i) transferring first data stored in the first latch circuit to an external device, the first data including at least a result of verify operation performed on the memory cells, (ii) transferring second data stored in the second latch circuit to the first latch circuit, the second data including a page of data to be written into the memory cells, and then (iii) transferring the second data stored in the first latch circuit to the external device, and the data restoring operation includes transferring the first data to the first latch circuit and the second data to the second latch circuit.

2. The device according to claim 1, wherein the control unit while executing the read operation overwrites contents of the first latch circuit.

3. The device according to claim 1, wherein during the data restoring operation, the second data is transferred from the external device to the first latch circuit and then from the first latch circuit to the second latch circuit, and the first data is transferred from the external device to the first latch circuit after transferring the second data from the first latch circuit to the second latch circuit.

4. The device according to claim 1, wherein the sense amplifier unit includes six latch circuits including the first latch circuit and the second latch circuit, and the control unit while performing the read operation overwrites contents of more than one latch circuit.

5. The device according to claim 4, wherein the control unit while performing the read operation overwrites contents of three of the six latch circuits.

6. A semiconductor memory device comprising:
first memory cells;
second memory cells;
a word line electrically connected to gates of the first and second memory cells;
a first sense amplifier unit including first and second latch circuits, the first sense amplifier unit electrically connected to the first memory cells through a first set of bit lines;
a second sense amplifier unit including third and fourth latch circuits, the second sense amplifier unit electrically connected to the second memory cells through a second set of bit lines; and
a control unit configured to execute a read operation and a write operation on the first and second memory cells, wherein the control unit, while executing the write operation on the first memory cells, responsive to a write suspend command followed by a read command, performs a data saving operation, the read operation, and a data restoring operation prior to resuming the write operation, wherein prior to the data saving operation, write data including first and second data are stored respectively in the first and second latch circuits, and the data saving operation includes transferring the first data stored in the first latch circuit to the fourth latch circuit, the first data being retained in the fourth latch circuit during the read operation, and the data restoring operation includes transferring the first data from the fourth latch circuit to the first latch circuit.

7. The device according to claim 6, wherein the control unit while executing the read operation overwrites contents of the first latch circuit.

8. The device according to claim 6, wherein the control circuit is configured to execute read and write operations in units of half-page.

9. The device according to claim 6, wherein the control circuit is configured to execute read and write operations in units of quarter-page.

10. The device according to claim 6, wherein each of the first and second sense amplifier units includes six latch circuits, and the control unit while performing the read operation on the first memory cells overwrites contents of more than one latch circuit of the first sense amplifier unit and the control unit while performing the read operation on the second memory cells overwrites contents of more than one latch circuit of the second sense amplifier unit.

11. A memory system comprising:
a semiconductor memory device including memory cells, and a sense amplifier unit including a first latch circuit and a second latch circuit; and
a controller including a buffer memory and configured to interrupt a write operation being performed in the semiconductor memory device with a read operation by transmitting a write suspend command while the semiconductor memory device is carrying out the write operation, executing a data saving operation, the read operation, and a data restoring operation in the semiconductor memory device, and then transmitting a write resume command, wherein during the data saving operation, (i) first data stored in the first latch circuit is transferred to the controller for storage in the buffer memory, the first data including at least a result of verify operation performed on the memory cells, (ii) second data stored in the second latch circuit is transferred to the first latch circuit, the second data including a page of data to be written into the memory cells, and then (iii) the second data stored in the first latch circuit is transferred to the controller for storage in the buffer memory, and during the data restoring operation, the controller transfers the first data and the second data to the semiconductor memory device for storage in the first latch circuit and the second latch circuit, respectively.

12. The memory system according to claim 11, wherein the controller, while executing data saving operation, transmits a first command to transfer the first data from the second latch circuit to the first latch circuit and a second command to transfer the data stored in the first latch circuit to the controller.

13. The memory system according to claim 12, wherein the first command identifies the second latch circuit as a data transmission source and the first latch circuit as a data transmission destination.

14. The memory system according to claim 11, wherein the controller, while executing data restoring operation, transmits a first command to transfer the first data from the controller to the first latch circuit and a second command to transfer the data stored in the first latch circuit to the second latch circuit.

15. The memory system according to claim 14, wherein the first command identifies the first latch circuit as a data transmission source and the second latch circuit as a data transmission destination.

16. The memory system according to claim 11, wherein the sense amplifier unit includes six latch circuits including the first latch circuit and the second latch circuit, and contents of more than one latch circuit are overwritten during the read operation.

17. The memory system according to claim 16, wherein contents of three of the six latch circuits are overwritten during the read operation.

\* \* \* \* \*